US012563925B2

(12) United States Patent
Wang et al.

(10) Patent No.: US 12,563,925 B2
(45) Date of Patent: Feb. 24, 2026

(54) DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Binyan Wang, Beijing (CN); Cong Liu, Beijing (CN); Qiwei Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 400 days.

(21) Appl. No.: 18/027,622

(22) PCT Filed: Apr. 11, 2022

(86) PCT No.: PCT/CN2022/086136
§ 371 (c)(1),
(2) Date: Mar. 21, 2023

(87) PCT Pub. No.: WO2023/197111
PCT Pub. Date: Oct. 19, 2023

(65) Prior Publication Data
US 2024/0306444 A1 Sep. 12, 2024

(51) Int. Cl.
*H10K 59/131* (2023.01)
*G09G 3/3233* (2016.01)

(52) U.S. Cl.
CPC ......... *H10K 59/131* (2023.02); *G09G 3/3233* (2013.01); *G09G 2300/0426* (2013.01);
(Continued)

(58) Field of Classification Search
CPC .............. H10K 59/131; G09G 3/3233; G09G 2300/0426; G09G 2300/0819;
(Continued)

(56) References Cited

U.S. PATENT DOCUMENTS

| | | |
|---|---|---|
| 2019/0074344 A1 | 3/2019 | Ka et al. |
| 2022/0293708 A1 | 9/2022 | Qiu et al. |

FOREIGN PATENT DOCUMENTS

| | | |
|---|---|---|
| CN | 111509019 A | 8/2020 |
| CN | 113421906 A | 9/2021 |

(Continued)

*Primary Examiner* — Jay C Kim
*Assistant Examiner* — Woo K Lee
(74) *Attorney, Agent, or Firm* — Ling Wu; Stephen Yang; Ling and Yang Intellectual Property

(57) ABSTRACT

A display substrate includes a base substrate (100), a circuit structure layer (20), a light emitting structure layer (4), at least one conductive layer, and at least one capacitance compensation layer (51). The base substrate (100) includes a first display region (A1) and a second display region (A2) at least partially surrounding the first display region (A1). The capacitance compensation layer (51) is located in the first display region (A1) and on a side of the light emitting structure layer (4) close to the base substrate (100). The capacitance compensation layer (51) includes at least one compensation capacitance electrode plate (511). An anode (411) of at least one first light emitting element (13) is electrically connected with the compensation capacitance electrode plate (511) of the capacitance compensation layer (51).

19 Claims, 15 Drawing Sheets

(52) U.S. Cl.
CPC .............. *G09G 2300/0819* (2013.01); *G09G 2300/0842* (2013.01); *G09G 2300/0861* (2013.01); *G09G 2310/08* (2013.01)

(58) Field of Classification Search
CPC ... G09G 2300/0842; G09G 2300/0861; G09G 2310/08

See application file for complete search history.

(56) References Cited

FOREIGN PATENT DOCUMENTS

| | | | | |
|---|---|---|---|---|
| CN | 113809112 A | * | 12/2021 | ......... H10K 59/8794 |
| EP | 4203051 A1 | | 6/2023 | |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2022/086136 having an international filing date of Apr. 11, 2022, the entire content of which is hereby incorporated by reference.

TECHNICAL FIELD

The present disclosure relates to, but is not limited to, the field of display technology, in particular to a display substrate and a display apparatus.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high reaction speed, lightness and thinness, bendability, and a low cost, etc. An under display camera technology is a brand-new technology proposed to increase a screen-to-body ratio of a display apparatus.

SUMMARY

The following is a summary of subject matters described herein in detail. The summary is not intended to limit the protection scope of claims.

An embodiment of the present disclosure provides a display substrate and a display apparatus.

In one aspect, an embodiment of the present disclosure provides a display substrate, includes a base substrate, a circuit structure layer, a light emitting structure layer, at least one conductive layer, and at least one capacitance compensation layer. The base substrate includes a first display region and a second display region at least partially surrounding the first display region. The circuit structure layer is located at a side of the base substrate and includes multiple first pixel circuits located in the second display region. The light emitting structure layer is located on a side of the circuit structure layer away from the base substrate and includes multiple first light emitting elements located in the first display region. At least one conductive layer is located between the circuit structure layer and the light emitting structure layer and includes multiple conductive lines. At least one first pixel circuit of the multiple first pixel circuits is electrically connected with at least one first light emitting element of the multiple first light emitting elements through a conductive line of the at least one conductive layer, and the at least one first pixel circuit is configured to drive the at least one first light emitting element to emit light. At least one capacitance compensation layer is located in the first display region and on a side of the light emitting structure layer close to the base substrate. The capacitance compensation layer includes at least one compensation capacitance electrode plate. An anode of the at least one first light emitting element is electrically connected with a compensation capacitance electrode plate of the at least one capacitance compensation layer. In some exemplary implementations, an orthographic projection of the anode of the first light emitting element on the base substrate contains an orthographic projection of a compensation capacitance electrode plate with which the first light emitting element is electrically connected on the base substrate.

In some exemplary implementations, a material of the at least one conductive layer includes a transparent conductive material.

In some exemplary implementations, the at least one capacitance compensation layer is located on a side of the at least one conductive layer close to the base substrate.

In some exemplary implementations, the at least one conductive layer includes multiple anodic connection electrodes; the compensation capacitance electrode plate of the at least one capacitance compensation layer is electrically connected with the anode of the first light emitting element through an anode connection electrode of the at least one conductive layer.

In some exemplary implementations, an orthographic projection of the compensation capacitance electrode plate on the base substrate is partially overlapped with an orthographic projection of the anode connection electrode of the at least one conductive layer on the base substrate.

In some exemplary implementations, the at least one conductive layer includes a first transparent conductive layer, a second transparent conductive layer, and a third transparent conductive layer provided sequentially in a direction away from the base substrate; the first transparent conductive layer includes multiple first anode connection electrodes, the second transparent conductive layer includes multiple third anode connection electrodes, and the third transparent conductive layer includes multiple fifth anode connection electrodes; the compensation capacitance electrode plate of the at least one capacitance compensation layer is electrically connected with the anode of the first light emitting element through a first anode connection electrode of the first transparent conductive layer, a third anode connection electrode of the second transparent conductive layer and a fifth anode connection electrode of the third transparent conductive layer.

In some exemplary implementations, the first transparent conductive layer further includes at least one first transparent conductive line, the second transparent conductive layer further includes at least one second transparent conductive line, and the third transparent conductive layer further includes at least one third transparent conductive line. An orthographic projection of the at least one compensation capacitance electrode plate on the base substrate is overlapped with at least one of an orthographic projection of the first transparent conductive line, an orthographic projection of the second transparent conductive line, and an orthographic projection of the third transparent conductive line on the base substrate.

In some exemplary implementations, the orthographic projection of the second transparent conductive line on the base substrate is overlapped with the orthographic projection of the first transparent conductive line on the base substrate, and the orthographic projection of the third transparent conductive line on the base substrate is overlapped with both the orthographic projection of the first transparent conductive line and the orthographic projection of the second transparent conductive line on the base substrate.

In some exemplary implementations, a first transparent conductive line and a first anode connection electrode are in an integral structure, a second transparent conductive line and a third anode connection electrode are in an integral structure, and a third transparent conductive line and a fifth anode connection electrode are in an integral structure.

In some exemplary implementations, a material of the capacitance compensation layer includes a metal material.

In some exemplary implementations, in a direction perpendicular to the display substrate, the circuit structure layer of the second display region includes a semiconductor layer, a first gate metal layer, a second gate metal layer and a first source-drain metal layer provided on the base substrate. The at least one capacitance compensation layer and one of the following are of a same layer structure: the first gate metal layer, the second gate metal layer and the first source-drain metal layer.

In some exemplary implementations, in a direction perpendicular to the display substrate, the circuit structure layer of the second display region includes: a semiconductor layer, a first gate metal layer, a second gate metal layer, and a first source-drain metal layer provided on the base substrate; the at least one capacitance compensation layer is located on a side of the first source-drain metal layer away from the base substrate.

In some exemplary implementations, the display substrate further includes a second source-drain metal layer located in the second display region and on a side of the circuit structure layer away from the base substrate. The at least one capacitance compensation layer and the second source-drain metal layer are of a same layer structure, or the at least one capacitance compensation layer is located between the first source-drain metal layer and the second source-drain metal layer.

In some exemplary implementations, in a row of first light emitting elements along a direction from a center to an edge of the first display region, a first light emitting element close to the center of the first display region is electrically connected with a first pixel circuit close to the first display region in the second display region, and a first light emitting element away from the center of the first display region is electrically connected with a first pixel circuit away from the first display region in the second display region. A compensation capacitance generated by the first light emitting element close to the center of the first display region by electrically connecting a compensation capacitance electrode plate is less than a compensation capacitance generated by the first light emitting element away from the center of the first display region by electrically connecting a compensation capacitance electrode plate.

In some exemplary implementations, the multiple first light emitting elements includes multiple first light emitting elements that emit light of a first color, multiple first light emitting elements that emit light of a second color, and multiple first light emitting elements that emit light of a third color; the multiple first light emitting elements that emit the light of the first color are electrically connected with multiple compensation capacitance electrode plates of the capacitance compensation layer.

In some exemplary implementations, the first color is green, the second color is red, and the third color is blue.

In some exemplary implementations, the circuit structure layer further includes multiple second pixel circuits located in the second display region, and the light emitting structure layer further includes multiple second light emitting elements located in the second display region. At least one second pixel circuit of the multiple second pixel circuits is electrically connected with at least one second light emitting element of the multiple second light emitting elements, and the at least one second pixel circuit is configured to drive the at least one second light emitting element to emit light.

In another aspect, an embodiment of the present disclosure provides a display apparatus, which includes the aforementioned display substrate.

In some exemplary implementations, the display apparatus further includes a photosensitive sensor located on a side of a non-display surface of the display substrate, and an orthographic projection of the photosensitive sensor on the display substrate is overlapped with the first display region of the display substrate.

In another aspect, an embodiment of the present disclosure provided a method for preparing a display substrate, for preparing the aforementioned display substrate, the preparation method includes forming a circuit structure layer, at least one capacitance compensation layer, at least one conductive layer, and a light emitting structure layer on a base substrate. The base substrate includes a first display region and a second display region at least partially surrounding the first display region, The circuit structure layer is located on a side of the base substrate and includes multiple first pixel circuits located in the second display region, and the light emitting structure layer is located on a side of the circuit structure layer away from the base substrate and includes multiple first light emitting elements located in the first display region. The at least one conductive layer is located between the circuit structure layer and the light emitting structure layer and includes multiple conductive lines. At least one first pixel circuit of the multiple first pixel circuits is electrically connected with at least one first light emitting element of the multiple first light emitting elements through a conductive line of the at least one conductive layer, the at least one first pixel circuit is configured to drive the at least one first light emitting element to emit light. The at least one capacitance compensation layer is located in the first display region and on a side of the light emitting structure layer close to the base substrate, and the capacitance compensation layer includes at least one compensation capacitance electrode plate. An anode of the at least one first light emitting element is electrically connected with a compensation capacitance electrode plate of the at least one capacitance compensation layer.

Other aspects may be understood upon reading and understanding the drawings and the detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but are not to constitute limitations on the technical solutions of the present disclosure. Shapes and sizes of one or more components in the drawings do not reflect true scales, but are only intended to schematically describe contents of the present disclosure.

DETAILED DESCRIPTION

Figures 1, 2:
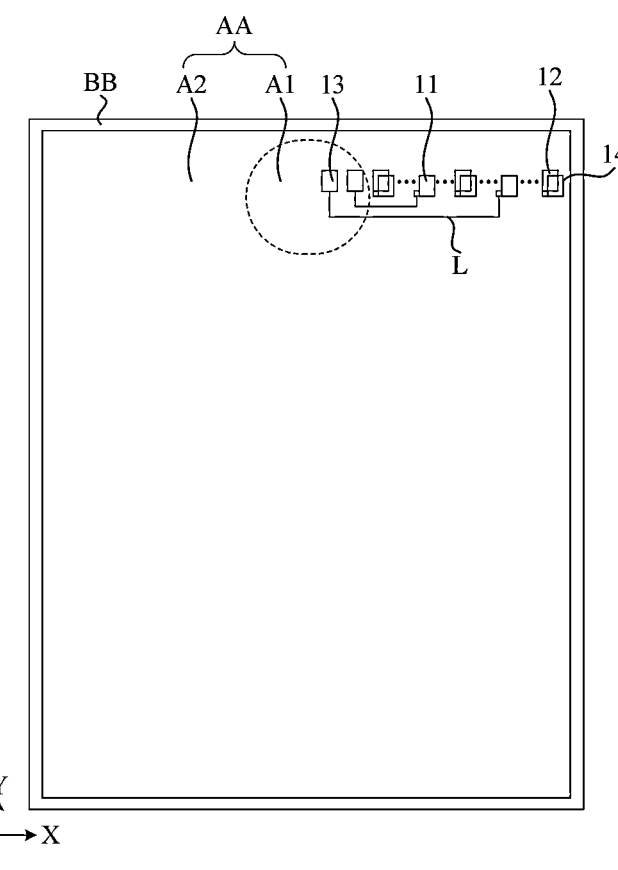
FIG. 1 is a schematic diagram of a display substrate according to at least one embodiment of the present disclosure.
FIG. 2 is an equivalent circuit diagram of a pixel circuit according to at least one embodiment of the present disclosure.

The embodiments of the present disclosure will be described below in combination with the drawings in detail. Implementations may be implemented in multiple different forms. Those of ordinary skill in the art may easily understand such a fact that manners and contents may be transformed into other forms without departing from the purpose and scope of the present disclosure. Therefore, the present disclosure should not be explained as being limited to contents described in following implementation modes only.

The embodiments in the present disclosure and features in the embodiments may be combined randomly with each other without conflict.

In the drawings, a size of one or more constituent elements, a thickness of a layer, or a region is sometimes exaggerated for clarity. Therefore, an implementation of the present disclosure is not necessarily limited to the size, and a shape and a size of one or more components in the drawings do not reflect a true proportion. In addition, the drawings schematically illustrate ideal examples, and an implementation of the present disclosure is not limited to the shapes, numerical values, or the like shown in the drawings.

Ordinal numerals such as "first", "second", and "third" in the specification are set to avoid confusion of constituent elements, but not to set a limit in quantity. In the present disclosure, "a plurality of" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements vary as appropriate according to a direction of a described constituent element. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, "electrical connection" includes a case that constituent elements are connected together through an element with a certain electrical effect. "An element with a certain electrical effect" is not particularly limited as long as electrical signals between the connected constituent elements may be transmitted. Examples of "an element with a certain electrical effect" not only include an electrode and a wiring, but further include a switch element such as a transistor, a resistor, an inductor, a capacitor, another element with a plurality of functions, etc.

In the specification, a transistor refers to an element which at least includes three terminals, i.e., a gate, a drain, and a source. The transistor has a channel region between the drain (drain electrode terminal, drain region, or drain electrode) and the source (source electrode terminal, source region, or source electrode), and a current may flow through the drain, the channel region, and the source. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchangeable. Therefore, the "source electrode" and the "drain electrode" may be exchangeable in the specification. In addition, the gate may also be referred to as a control electrode.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

A "light transmission rate" in the present disclosure refers to an ability of light passing through a medium, and is a percentage of the luminous flux passing through a transparent or translucent body to its incident luminous flux.

In the present disclosure, "about" and "substantially" refer to a case that a boundary is not defined strictly and a process and measurement error within a range is allowed. In the present disclosure, "substantially same" is a case where values differ by less than 10%.

This embodiment provides a display substrate, which includes a base substrate, a circuit structure layer, a light emitting structure layer, at least one conductive layer and at least one capacitance compensation layer. A base substrate includes a first display region and a second display region at least partially surrounding the first display region. The circuit structure layer is located at a side of the base substrate and includes multiple first pixel circuits located in the second display region. The light emitting structure layer is located on a side of the circuit structure layer away from the base substrate and includes multiple first light emitting elements located in the first display region. At least one conductive layer is located between the circuit structure layer and the light emitting structure layer and includes multiple conductive lines. At least one first pixel circuit of the multiple first pixel circuits is electrically connected with at least one first light emitting element of the multiple first light emitting elements through a conductive line of at least one conductive layer, and the at least one first pixel circuit is configured to drive the at least one first light emitting element to emit light. At least one capacitance compensation layer is located in the first display region and on a side of the light emitting structure layer close to the base substrate. The capacitance compensation layer includes at least one compensation capacitance plate. An anode of at least one first light emitting element is electrically connected with a compensation capacitance electrode plate of at least one capacitance compensation layer.

In some examples, the first display region may be provided with a capacitance compensation layer, or may be provided with multiple capacitance compensation layers. For example, anodes of multiple first light emitting elements emitting light of a same color may be electrically connected with multiple compensation capacitance electrode plates of a same capacitance compensation layer, and anodes of first light emitting elements emitting light of different colors may be electrically connected with compensation capacitance electrode plates of different capacitance compensation layers. As another example, anodes of all the first light emitting elements in the first display region may be electrically connected with multiple compensation capacitance electrode plates in a same capacitance compensation layer. However, the embodiment is not limited thereto.

The display substrate provided by the embodiment may increase the capacitance of an anode of the first light emitting element by setting the anode of the first light emitting element to be electrically connected with a compensation capacitance electrode plate, thereby improving a brightness difference of the first display region and improving the display effect of the display substrate.

In some exemplary implementations, an orthographic projection of the anode of the first light emitting element on the base substrate may contain an orthographic projection of the compensation capacitance electrode plate to which it is electrically connected on the base substrate. In this example, the orthographic projection of the anode of the first light emitting element on the base substrate may cover the orthographic projection of the compensation capacitance electrode plate to which it is electrically connected with on the base substrate to ensure a light transmittance of the first display region.

In some exemplary implementations, the material of at least one conductive layer may include a transparent conductive material. For example, the material of at least one conductive layer may include indium tin oxide (ITO). However, the embodiment is not limited thereto.

In some exemplary implementations, at least one capacitance compensation layer may be located on a side of at least one conductive layer close to the base substrate. In some examples, at least one conductive layer may include multiple anode connection electrodes. A compensation capacitance electrode plate of at least one capacitance compensation layer may be electrically connected with an anode of the first light emitting element through an anode connection electrode of the conductive layer. In some examples, the orthographic projection of the compensation capacitance electrode plate on the base substrate may be partially overlapped with an orthographic projection of the anode connection electrode of the at least one conductive layer on the base substrate.

In some exemplary implementations, at least one conductive layer may include a first transparent conductive layer, a second transparent conductive layer, and a third transparent conductive layer provided sequentially in a direction away from the base substrate. The first transparent conductive layer may include multiple first anode connection electrodes, the second transparent conductive layer may include multiple third anode connection electrodes, and the third transparent conductive layer may include multiple fifth anode connection electrodes. The compensation capacitance electrode plate of at least one capacitance compensation layer may be electrically connected with an anode of the first light emitting element through a first anode connection electrode of the first transparent conductive layer, a third anode connection electrode of the second transparent conductive layer, and a fifth anode connection electrode of the third transparent conductive layer. In this example, a compensation capacitance electrode plate is electrically connected with an anode of a first light emitting element by sequentially connecting multiple anode connection electrodes. However, the embodiment is not limited thereto. For example, the compensation capacitance electrode plate may be directly electrically connected with the anode of the first light emitting element.

In some exemplary implementations, the first transparent conductive layer may further include at least one first transparent conductive line, the second transparent conductive layer may further include at least one second transparent conductive line, and the third transparent conductive layer may further include at least one third transparent conductive line. The orthographic projection of at least one compensation capacitance electrode plate on the base substrate may be overlapped with an orthographic projection of at least one of the first transparent conductive line, the second transparent conductive line, and the third transparent conductive line on the base substrate. For example, the orthographic projection of the at least one compensation capacitance electrode plate on the base substrate may be overlapped with orthographic projections of at least one (e.g. one, two or three) first transparent conductive line, at least one (e.g. one, two or three) second transparent conductive line, and at least one (e.g. one, two or three) third transparent conductive line on the base substrate. As another example, the orthographic projection of at least one compensation capacitance electrode plate on the base substrate may be overlapped with orthographic projections of the first transparent conductive line and the second transparent conductive line on the base substrate. As another example, the orthographic projection of at least one compensation capacitance electrode plate on the base substrate may be overlapped with orthographic projections of the second transparent conductive line and the third transparent conductive line on the base substrate. However, the embodiment is not limited thereto.

In some exemplary implementations, an orthographic projection of the second transparent conductive line on the base substrate may be overlapped with an orthographic projection of the first transparent conductive line on the base substrate, and an orthographic projection of the third transparent conductive line on the base substrate may be overlapped with both the orthographic projection of the first transparent conductive line and the orthographic projection of the second transparent conductive line on the base substrate. However, the embodiment is not limited thereto.

In some exemplary implementations, a material of the capacitance compensation layer may include a metallic material. By adopting a capacitance compensation layer of a metal material, it is possible to increase a capacitance of the anode of the first light emitting element and avoid increasing a resistance, thereby improving the brightness difference of the first display region.

In some exemplary implementations, in a direction perpendicular to the display substrate, the circuit structure layer of the second display region may include: a semiconductor layer, a first gate metal layer, a second gate metal layer, and a first source-drain metal layer provided on the base substrate. At least one capacitance compensation layer and one of the followings may be of a same layer structure: the first gate metal layer, the second gate metal layer, and the first source-drain metal layer. For example, the capacitance compensation layer of the first display region and the first source-drain metal layer of the second display region may be of a same layer structure, or the capacitance compensation layer of the first display region and the second gate metal layer of the second display region may be of a same layer structure. However, the embodiment is not limited thereto. In this example, by setting the capacitance compensation layer and any metal layer in the circuit structure layer in the second display region to be of a same layer structure, it is beneficial to simplify the preparation process.

In some exemplary implementations, in a direction perpendicular to the display substrate, the circuit structure layer of the second display region may include: a semiconductor layer, a first gate metal layer, a second gate metal layer, and a first source-drain metal layer provided on the base substrate. At least one capacitance compensation layer may be located on a side of the first source-drain metal layer away from the base substrate. In some examples, the display substrate may also include a second source-drain metal layer located in the second display region and on a side of the circuit structure layer away from the base substrate. At least one capacitance compensation layer and the second source-drain metal layer may be of a same layer structure, or at least one capacitance compensation layer may be located between the first source-drain metal layer and the second source-drain metal layer. However, the embodiment is not limited thereto. In other examples, the capacitance compensation layer may be located between the light emitting structure layer and the conductive layer, or the capacitance compensation layer may be located between two adjacent conductive layers.

In some exemplary implementations, in a row of the first light emitting elements along a direction from a center to an edge of the first display region, a first light emitting element close to the center of the first display region may be electrically connected with a first pixel circuit close to the first display region in a second display region, and a first light emitting element away from the center of the first display region may be electrically connected with a first pixel circuit away from the first display region in the second display region. A compensation capacitance generated by the first light emitting element close to the center of the first display region by electrically connecting a compensation capacitance electrode plate may be less than a compensation capacitance generated by the first light emitting element away from the center of the first display region by electrically connecting a compensation capacitance electrode plate. In this example, by increasing the anode capacitance of a row of first light emitting elements as a whole, the difference in anode capacitance of a row of first light emitting elements may be reduced, thereby improving the brightness difference of the first display region.

In some exemplary implementations, multiple first light emitting elements may include: multiple first light emitting elements emitting light of a first color, multiple first light emitting elements emitting light of a second color, and multiple first light emitting elements emitting light of a third color. The multiple first light emitting elements emitting light of the first color are electrically connected with multiple compensation capacitance electrode plates of the capacitance compensation layer. In some examples, the first color may be green, the second color may be red, and the third color may be blue. In this example, only the first light emitting element emitting green light may be set to be connected with the compensation capacitance electrode plate to improve the brightness difference of the first display region. However, the embodiment is not limited thereto. For example, all the first light emitting elements in the first display region of the display substrate may be connected with compensation capacitance electrode plates.

In some exemplary implementations, the circuit structure layer may further include multiple second pixel circuits located in the second display region, and the light emitting structure layer may further include multiple second light emitting elements located in the second display region. At least one second pixel circuit of the multiple second pixel circuits is electrically connected with at least one second light emitting element of the multiple second light emitting elements, and the at least one second pixel circuit is configured to drive the at least one second light emitting element to emit light.

Solutions of the embodiment will be described below through some examples. The display substrate suitable for full screen and under display camera technology will be described as an example. However, the embodiment is not limited thereto.

FIG. 1 is a schematic diagram of a display substrate according to at least one embodiment of the present disclosure. In some exemplary implementations, as shown in FIG. 1, the display substrate may include a display region AA and a peripheral region BB. The peripheral region BB may be a non-display region. The display region AA may include a first display region A1 and a second display region A2. For example, hardware such as a photosensitive sensor (e.g. a camera) is provided on a side of the display substrate and an orthographic projection of the photosensitive sensor on the display substrate is overlapped with the first display region A1. The first display region A1 may be a transparent display region, and the first display region A1 can also be referred to as an Under Display Camera (UDC) region; the second display region A2 may be a normal display region. For example, the second display region A2 may be opaque but only used for displaying. The display substrate of this embodiment may lay a solid foundation for the realization of a true full screen.

In some exemplary implementations, as shown in FIG. 1, the first display region A1 may be located at a center position of the top of the display region AA. The second display region A2 may surround the first display region A1. However, the embodiment is not limited thereto. For example, the first display region A1 may be located in other positions such as an upper left corner or an upper right corner of the display region AA. For example, the second display region A2 may surround at least one side of the first display region A1.

In some exemplary implementations, as shown in FIG. 1, the display region AA may have a shape of a rectangle, e.g., a rounded rectangle. The second display region A2 may be circular. However, the embodiment is not limited thereto. For example, the second display region may be rectangular, other pentagonal, hexagonal or in another shape.

In some exemplary implementations, the display region AA may be provided with multiple sub-pixels. At least one sub-pixel may include a pixel circuit and a light emitting element. The pixel circuit may be configured to drive a connected light emitting element. For example, the pixel circuit may be configured to provide a driving current to drive the light emitting element to emit light. The pixel circuit may include multiple transistors and at least one capacitor, for example, the pixel circuit may be of a 3T1C (i.e., three transistors and one capacitor) structure, a 7T1C (i.e., seven transistors and one capacitor) structure, a 5T1C (i.e., five transistors and one capacitor) structure, an 8T1C (eight transistors and one capacitor) structure, or a 8T2C (eight transistors and two capacitors) structure, or the like. In some examples, the light emitting element may be an Organic Light Emitting Diode (OLED), and the light emitting element emits red light, green light, blue light, or white light, etc. when driven by a pixel circuit corresponding to the light emitting element. A color of light emitted from the light emitting element may be determined as required. In some examples, the light emitting element may include an anode, a cathode, and an organic emitting layer located between the anode and the cathode. The anode of the light emitting element may be electrically connected with a corresponding pixel circuit. However, the embodiment is not limited thereto.

In some exemplary implementations, a pixel unit in the display region AA may include three sub-pixels, wherein the three sub-pixels may be a red sub-pixel, a green sub-pixel, and a blue sub-pixel respectively. However, the embodiment is not limited thereto. In some examples, one pixel unit may include four sub-pixels, which may be a red sub-pixel, a green sub-pixel, a blue sub-pixel, and a white sub-pixel respectively.

In some exemplary implementations, a shape of the light emitting element may be a rectangle, a rhombus, a pentagon, or a hexagon. When a pixel unit includes three sub-pixels, light emitting elements of the three sub-pixels may be arranged side by side horizontally, side by side vertically, or in a manner like a Chinese character "品". When a pixel unit includes four sub-pixels, light emitting elements of the four sub-pixels may be arranged side by side horizontally, side by side vertically, or in a manner to form a square. However, the embodiment is not limited thereto.

Figure 3:
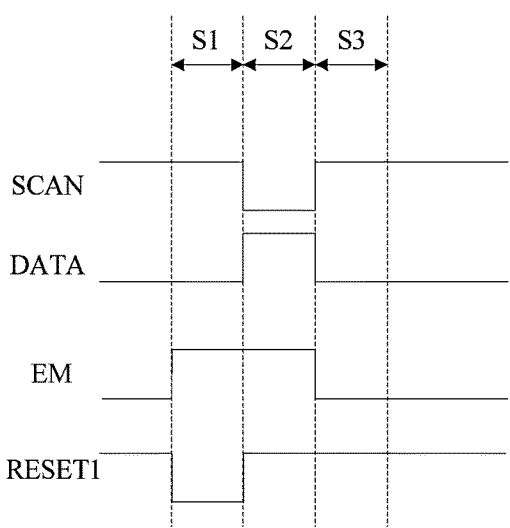
FIG. 3 is a working timing diagram of the pixel circuit provided in FIG. 2.

FIG. 2 is an equivalent circuit diagram of a pixel circuit according to at least one embodiment of the present disclosure. FIG. 3 is a working timing diagram of the pixel circuit provided in FIG. 2. The pixel circuit of this exemplary embodiment is described by taking the 7T1C structure as an example. However, the embodiment is not limited thereto.

In some exemplary implementations, as shown in FIG. 2, the pixel circuit of this example may include six switching transistors (T1, T2, and T4 to T7), a driving transistor T3, and a storage capacitor Cst. The six switching transistors are a data writing transistor T4, a threshold compensation transistor T2, a first light emitting control transistor T5, a second light emitting control transistor T6, a first reset transistor T1, and a second reset transistor T7, respectively. The light emitting element EL may include an anode, a cathode and an organic light emitting layer provided between the anode and the cathode.

In some exemplary implementations, the driving transistor and the six switching transistors may be P-type transistors or may be N-type transistors. Adopting a same type of transistors in a pixel circuit may simplify a process flow, reduce a process difficulty of a display substrate, and improve a yield of products. In some possible implementations, the driving transistor and the six switching transistors may include a P-type transistor and an N-type transistor.

In some exemplary implementations, a Low Temperature Poly-Silicon thin film transistor, or an oxide thin film transistor, or a Low Temperature Poly-Silicon thin film transistor and an oxide thin film transistor may be adopted for the driving transistor and the six switching transistors. An active layer of a Low Temperature Poly-Silicon thin film transistor is made of Low Temperature Poly-Silicon (LTPS), and an active layer of an oxide thin film transistor is made of an oxide semiconductor (Oxide). A Low-temperature Poly-Silicon thin film transistor has advantages such as a high mobility, fast charging, and the like, while an oxide thin film transistor has an advantage such as a low leakage current, and the like. The Low Temperature Poly-Silicon thin film transistor and the oxide thin film transistor are integrated on a display substrate to form a Low Temperature Polycrystalline Oxide (LTPO) display substrate, and advantages of both the Low Temperature Poly-Silicon thin film transistor and the oxide thin film transistor may be utilized, which may achieve low frequency driving, reduce power consumption, and improve display quality.

In some exemplary implementations, as shown in FIG. 2, a display substrate may include a scan line GL, a data line DL, a first power supply line PL1, a second power supply line PL2, an emitting control line EML, a first initial signal line INIT1, a second initial signal line INIT2, a first reset control line RST1, and a second reset control line RST2. In some examples, the first power supply line PL1 may be configured to provide a constant first voltage signal VDD to a pixel circuit, the second power supply line PL2 may be configured to provide a constant second voltage signal VSS to a pixel circuit, and the first voltage signal VDD is greater than the second voltage signal VSS. The scan line GL may be configured to provide a scan signal SCAN to the pixel circuit, the data line DL may be configured to provide a data signal DATA to the pixel circuit, the light emitting control line EML may be configured to provide a light emitting control signal EM to the pixel circuit, the first reset control line RST1 may be configured to provide a first reset control signal RESET1 to the pixel circuit, and the second reset control line RST2 may be configured to provide a second reset control signal RESET2 to the pixel circuit. In some examples, in an n-th row of pixel circuits, a first reset control line RST1 may be electrically connected with a scan line GL of an (n−1)-th row of pixel circuits to be inputted with a scan signal SCAN(n−1), that is, a first reset control signal RESET1($n$) is the same as the scan signal SCAN(n−1). A second reset control line RST2 may be electrically connected with a scan line GL of an n-th row of pixel circuits to be inputted with a scan signal SCAN(n), that is, a second reset control signal RESET2($n$) is the same as the scan signal SCAN(n−1). In some examples, a second reset control line RST2 with which the n-th row of pixel circuits is electrically connected and a first reset control line RST1 with which the (n+1)-th row of pixel circuits is electrically connected may be of an integral structure. Herein, n is an integer greater than 0. Thus, signal lines of the display substrate may be reduced, and a narrow frame design of the display substrate may be achieved. However, the embodiment is not limited thereto.

In some exemplary implementations, the first initial signal line INIT1 may be configured to provide a first initial signal to the pixel circuit, the second initial signal line INIT2 may be configured to provide a second initial signal to the pixel circuit. For example, the first initial signal may be different from the second initial signal. The first initial signal and the second initial signal may be constant voltage signals, and their magnitudes may be between a first voltage signal VDD and a second voltage signal VSS, but not limited to this. In other examples, the first initial signal and the second initial signal may be the same and only the first initial signal line may be configured to provide the first initial signal.

In some exemplary implementations, as shown in FIG. 2, a driving transistor T3 is electrically connected with a light emitting element EL, and outputs a driving current to drive the light emitting element EL to emit light under control of a scan signal SCAN, a data signal DATA, a first voltage signal VDD, a second voltage signal VSS and etc. A gate of a data writing transistor T4 is electrically connected with a scan line GL, a first electrode of the data writing transistor T4 is electrically connected with a data line DL, and a second electrode of the data writing transistor T4 is electrically connected with a first electrode of the driving transistor T3. A gate of a threshold compensation transistor T2 is electrically connected with a scan line GL, a first electrode of the threshold compensation transistor T2 is electrically connected with a gate of the driving transistor T3, and a second electrode of the threshold compensation transistor T2 is electrically connected with a second electrode of the driving transistor T3. A gate of a first light emitting control transistor T5 is electrically connected with a light emitting control line EML, a first electrode of the first light emitting control transistor T5 is electrically connected with a first power supply line PL1, and a second electrode of the first light emitting control transistor T5 is electrically connected with the first electrode of the driving transistor T3. A gate of a second light emitting control transistor T6 is electrically connected with the light emitting control line EML, a first electrode of the second light emitting control transistor T6 is electrically connected with the second electrode of the driving transistor T3, and a second electrode of the second light emitting control transistor T6 is electrically connected with an anode of the light emitting element EL. A first reset transistor T1 is electrically connected with the gate of the driving transistor T3 and configured to reset the gate of the driving transistor T3, and a second reset transistor T7 is electrically connected with the anode of the light emitting element EL and configured to reset the anode of the light emitting element EL. A gate of the first reset transistor T1 is electrically connected with a first reset control line RST1, a first electrode of the first reset transistor T1 is electrically connected with a first initial signal line INIT1, and a second electrode of the first reset transistor T1 is electrically connected with the gate of the driving transistor T3. A gate of the second reset transistor T7 is electrically connected with a second reset control line RST2, a first electrode of the second reset transistor T7 is electrically connected with a second initial signal line INIT2, and a second electrode of the second reset transistor T7 is electrically connected with the anode of the light emitting element EL. A first capacitance electrode plate of a storage capacitor Cst is electrically connected with the gate of the driving transistor T3, and a second capacitance electrode plate of the storage capacitor Cst is electrically connected with the first power supply line PL1.

In this example, a first node N1 is a connection point for the storage capacitor Cst, the first reset transistor T1, the driving transistor T3, and the threshold compensation transistor T2, a second node N2 is a connection point for the first light emitting control transistor T5, the data writing transistor T4, and the driving transistor T3, a third node N3 is a connection point for the driving transistor T3, the threshold compensation transistor T2, and the second light emitting control transistor T6, and a fourth node N4 is a connection point for the second light emitting control transistor T6, the second reset transistor T7, and the light emitting element EL.

A working process of the pixel circuit illustrated in FIG. 2 will be described below with reference to FIG. 3. The description is given by taking a case in which multiple transistors included in the pixel circuit shown in FIG. 2 are all P-type transistors as an example.

In some exemplary implementations, as shown in FIG. 3, during a display period of one frame, the working process of the pixel circuit may include a first stage S1, a second stage S2, and a third stage S3.

The first stage S1 is referred to as a reset stage. A first reset control signal RESET1 provided by the first reset control line RST1 is a low level signal, so that the first reset transistor T1 is turned on, and a first initial signal provided by the first initial signal line INIT1 is provided to the first node N1 to initialize the first node N1 and clear an original data voltage in the storage capacitor Cst. A scan signal SCAN provided by the scan line GL is a high level signal, and a light emitting control signal EM provided by the light emitting control line EML is a high level signal, so that the data writing transistor T4, the threshold compensation transistor T2, the first light emitting control transistor T5, the second light emitting control transistor T6, and the second reset transistor T7 are turned off. In this stage, the light emitting element EL does not emit light.

The second stage S2 is referred to as a data writing stage or a threshold compensation stage. A scan signal SCAN provided by the scan line GL is a low level signal, a first reset control signal RESET1 provided by the first reset control line RST1 and an emitting control signal EM provided by the emitting control line EML are both high level signals, and the data line DL outputs a data signal DATA. In this stage, the first capacitance electrode plate of the storage capacitor Cst is at a low level, so that the driving transistor T3 is turned on. The scan signal SCAN is a low level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on driving transistor T3, the third node N3, and the turned-on threshold compensation transistor T2, and the storage capacitor Cst is charged with a difference between the data voltage Vdata output by the data line DL and a threshold voltage of the driving transistor T3. A voltage of a first capacitance electrode plate (that is, the first node N1) of the storage capacitor Cst is Vdata−|Vth|, Vdata is the data voltage output by the data line DL, and Vth is the threshold voltage of the driving transistor T3. The second reset transistor T7 is turned on, so that a second initial signal provided by the second initial signal line INIT2 is provided to the anode of the light emitting element EL to initialize (reset) the anode of the light emitting element EL and clear a pre-stored voltage therein, so as to complete initialization, thereby ensuring that the light emitting element EL does not emit light. The first reset control signal RESET1 provided by the first reset control line RST1 is a high level signal, so that the first reset transistor T1 is turned off. The light emitting control signal EM provided by the light emitting control signal line EML is a high level signal, so that the first light emitting control transistor T5 and the second light emitting control transistor T6 are turned off.

The third stage S3 is referred to as a light emitting stage. A light emitting control signal EM provided by the light emitting control signal line EML is a low level signal, and a scan signal SCAN provided by the scan line GL and a first reset control signal RESET1 provided by the first reset control line RST1 are high level signals. The light emitting control signal EM provided by the light emitting control signal line EML is a low level signal, so that the first light emitting control transistor T5 and the second light emitting control transistor T6 are turned on, and a first voltage signal VDD output by the first power supply line PL1 provides a driving voltage to an anode of the light emitting element EL through the turned-on first light emitting control transistor T5, driving transistor T3, and second light emitting control transistor T6 to drive the light emitting element EL to emit light.

In a driving process of the pixel circuit, a driving current flowing through the driving transistor T3 is determined by a voltage difference between the gate and the first electrode of the driving transistor T3. Because the voltage of the first node N1 is Vdata−|Vth|, the driving current of the driving transistor T3 is as follows.

$$I = K \times (Vgs − Vth)^2 =$$
$$K \times [(VDD − V\,data + |Vth|) − Vth]^2 = K \times [VDD − V\,data]^2$$

I is the driving current flowing through the driving transistor T3, that is, the driving current for driving the light emitting element EL; K is a constant; Vgs is the voltage difference between the gate and the first electrode of the driving transistor T3; Vth is the threshold voltage of the driving transistor T3; Vdata is the data voltage output by the data line DL; and VDD is the first voltage signal output by the first power supply line PL1.

It may be seen from the above formula that a current flowing through the light emitting element EL has nothing to do with the threshold voltage of the driving transistor T3. Therefore, the pixel circuit of the embodiment may better compensate the threshold voltage of the driving transistor T3.

In some exemplary implementations, as shown in FIG. 1, the first display region A1 may include multiple first light emitting elements 13. The second display region A2 may include multiple first pixel circuits 11, multiple second pixel circuits 12, multiple second light emitting elements 14, and multiple invalid pixel circuits. At least one second pixel circuit 12 of the multiple second pixel circuits 12 may be connected with at least one second light emitting element 14 of the multiple second light emitting elements 14, and an orthographic projection of at least one second pixel circuit 12 on a base substrate may be at least partially overlapped with an orthographic projection of at least one second light emitting element 14 on the base substrate. At least one second pixel circuit 12 may be configured to provide a driving signal to a second light emitting element 14 with which the second pixel circuit 10 is connected to drive the second light emitting element 14 to emit light. At least one first pixel circuit 11 of the multiple first pixel circuits 11 may be electrically connected with at least one first light emitting element 13 of the multiple first light emitting elements 13 through a transparent conductive line L. An orthographic projection of at least one first pixel circuit 11 on the base substrate may be not overlapped with an orthographic projection of at least one first light emitting element 13 on the base substrate. One end of the transparent conductive line L is electrically connected with the first pixel circuit 11, and the other end of the transparent conductive line L is electrically connected with the first light emitting element 13. The transparent conductive line L may extend from the first display region A1 to the second display region A2. For example, the transparent conductive line L may extend from the first display region A1 to the second display region A2 along the first direction X; or, the transparent conductive line L may first extend along the second direction Y in the first display region A1, and then extend along the first direction X to the second display region A2. However, the embodiment is not limited thereto.

In some exemplary implementations, the transparent conductive line L may be made of a transparent conductive material, for example, a conductive oxide material such as indium tin oxide (ITO). However, the embodiment is not limited thereto. In some examples, the transparent conductive lines L may be arranged in a transparent conductive layer, or multiple transparent conductive lines L may be arranged in two or three transparent conductive layers. Each of the transparent conductive lines L may be connected with a first pixel circuit 11 and a first light emitting element 13. Or, a first pixel circuit 11 and a first light emitting element 13 may be connected sequentially through multiple transparent conductive lines L located in different transparent conductive layers to realize electrical connection.

In an embodiment of the present disclosure, a row of light emitting elements may refer to that pixel circuits connected with the row of light emitting elements are all connected with a same gate line (for example, a scan line). A row of pixel circuits may refer to that the row of pixel circuits is all connected with a same gate line. However, the embodiment is not limited thereto.

Figure 4:
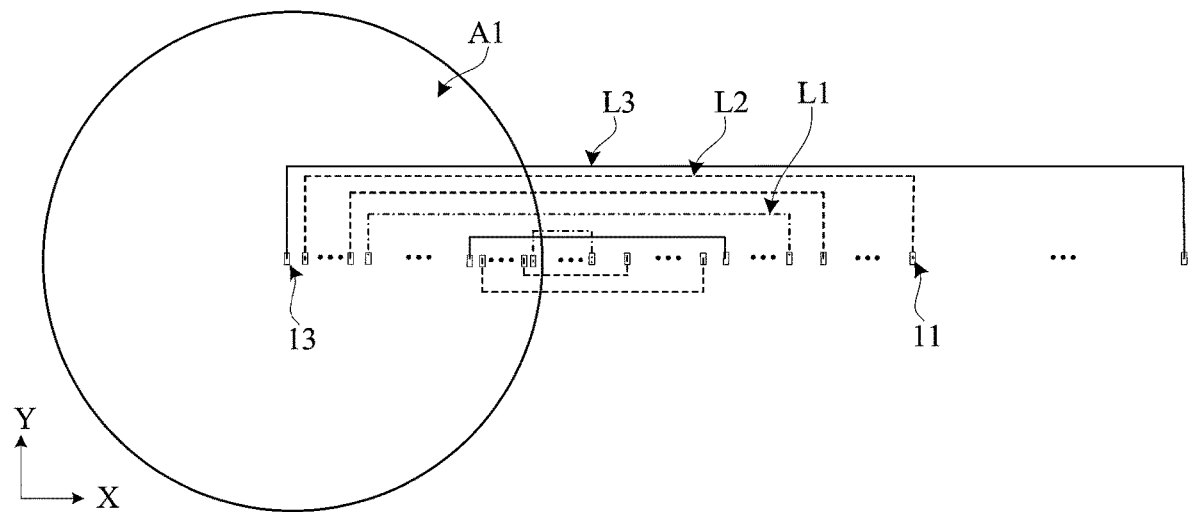
FIG. 4 is a schematic diagram of a connection between a first pixel circuit and a first light emitting element according to at least one embodiment of the present disclosure.

FIG. 4 is a schematic diagram of a connection between a first pixel circuit and a first light emitting element according to at least one embodiment of the present disclosure. FIG. 4 illustrates a row of first light emitting elements in the first display region A1 and a row of pixel circuits in the second display region A2 as an example. As shown in FIG. 4, taking the display substrate including three transparent conductive layers as an example, the first transparent conductive layer may include multiple first transparent conductive lines L1, the second transparent conductive layer may include multiple second transparent conductive lines L2, and the third transparent conductive layer may include multiple third transparent conductive lines L3. In FIG. 4, a first transparent conductive line L1 is illustrated by dot dash lines, a second transparent conductive line L2 is illustrated by dashed lines, and a third transparent conductive line L3 is illustrated by solid lines. The first transparent conductive layer, the second transparent conductive layer, and the third transparent conductive layer may be arranged sequentially along a side away from the base substrate.

In some examples, as shown in FIG. 4, the first light emitting element 13 may be electrically connected with the first pixel circuit 11 through a first transparent conductive line L1, a second transparent conductive line L2, or a third transparent conductive line L3. In a row of first light emitting elements 13, along a first direction X from the center to the edge of the first display region A1, a first light emitting element 13 close to the center of the first display region A1 is electrically connected with a first pixel circuit 11 away from the first display region A1, and a first light emitting element 13 away from the center of the first display region A1 is electrically connected with a first pixel circuit 11 close to the first display region A1. The closer to the edge of the first display region A1, the length of the transparent conductive line connected with the first light emitting element 13 is shorter, and the closer to the center of the first display region A1, the length of the transparent conductive line connected with the first light emitting element 13 is longer.

Taking the first pixel circuit 11 being the pixel circuit of 7T1C shown in FIG. 2 as an example, the fourth node N4 of the first pixel circuit 11 may be electrically connected with the anode of the first light emitting element 13 through a transparent conductive line. Since the lengths of the transparent conductive lines connected with the multiple first light emitting elements 13 located in the first display region A1 are different, the capacitances of the anodes of the different first light emitting elements 13 (i.e., the fourth node N4 of the first pixel circuit) are varied differently. The anode capacitance of the first light emitting element is relative large, which leads to a relative long illumination turned-on time length of the first light emitting element. The capacitances of anodes of different first light emitting elements are quite different, which may easily cause a difference in the illumination turned-on time lengths of the first light emitting elements, so that the brightness difference of the first display region occurs, resulting in defective display.

Figure 5A:
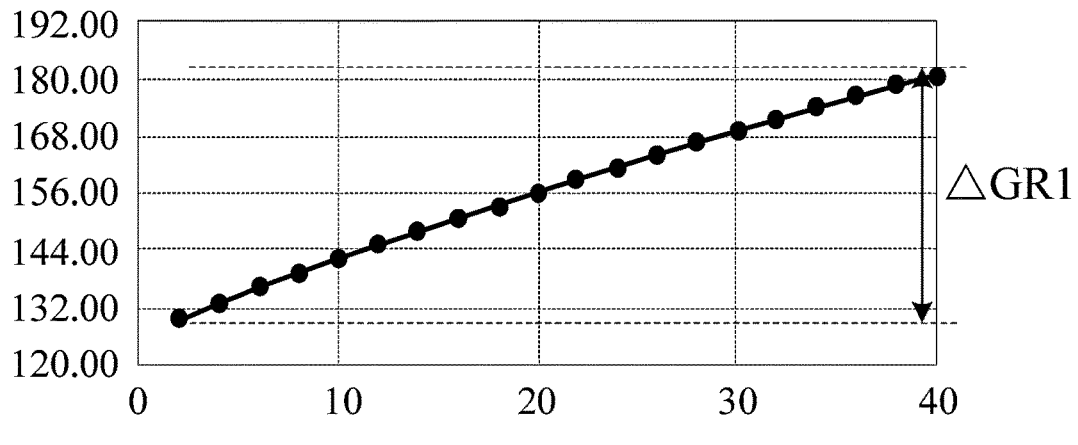
FIG. 5A and FIG. 5B show a gray scale difference generated by connecting first light emitting elements of a same row of a display substrate with transparent conductive lines of different lengths.
Figure 5B:
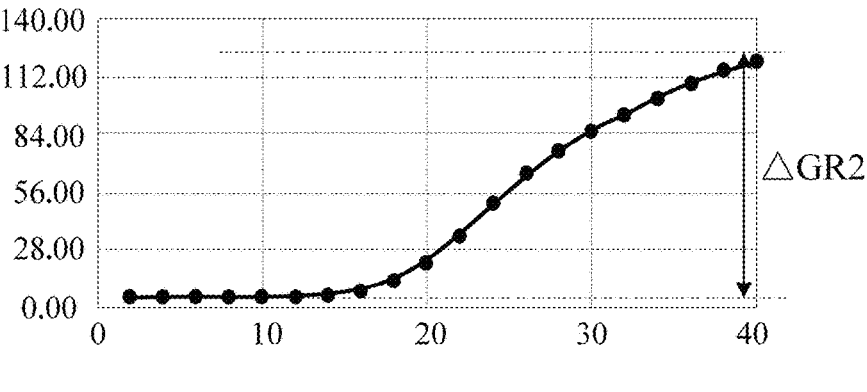

FIG. 5A and FIG. 5B show a gray scale difference generated by connecting first light emitting elements in a same row of a display substrate with transparent conductive lines of different lengths. FIG. 5A and FIG. 5B illustrate display differences between first light emitting elements emitting green light in a first display region. The x-axis in FIG. 5A and FIG. 5B is the position of the first light emitting element that emits green light from the center to the edge of the first display region in the first direction X, and the y-axis indicates the gray scale. FIG. 5A shows the brightness of the first light emitting element that emits green light in the first display region at 128 gray scale, and FIG. 5B shows the brightness of the first light emitting element that emits green light in the first display region at 32 gray scale. As can be seen from FIG. 5A, the difference of display gray scale between the first light emitting element which emits green light closest to the center of the first display region and the first light emitting element which emits green light farthest away from the center of the first display region, ΔGR1=50.86. As can be seen from FIG. 5B, the difference of display gray scale between the first light emitting element which emits green light closest to the center of the first display region and the first light emitting element which emits green light farthest away from the center of the first display region, ΔGR2=115.29. Also as shown in FIG. 5B, multiple first light emitting elements that emit green light and are close to the center of the first display region cannot even be turned on. Therefore, at a low gray scale, the display difference between the first light emitting element that emits green light and is closest to the center of the first display region and the first light emitting element that emits green light and is farthest away from the center of the first display region is large, and the multiple first light emitting elements close to the center of the first display region cannot be turned on. It can be seen that in a low gray scale, there exists a case where the first light emitting element displays abnormally due to a large difference in the lengths of the transparent conductive lines to which the first light emitting element is electrically connected, resulting in a defective display in the first display region. Further, it is known from the research of the inventor that, in a low gray scale, the defective degree of the first light emitting element emitting green light is greater than that of the first light emitting element emitting red light, and the defective degree of the first light emitting element emitting red light is greater than that of the first light emitting element emitting blue light.

The difference in anode capacitance of the first light emitting element can be reduced by reducing the difference in length of the transparent conductive line to which the first light emitting element is electrically connected, in view of the case that the difference in anode capacitance of the first light emitting element varies due to the difference in length of the transparent conductive line to which the first light emitting element is connected. However, the above method cannot play an improving role when the length of the transparent conductive line cannot be further optimized. In view of the above situation, the display substrate provided in the embodiment reduces the anode capacitance difference caused by the length difference of the transparent conductive line by increasing the anode capacitance of the first light emitting element, thereby improving the display effect of the first display region. The brightness difference between the first display region and the second display region can be improved by using dual-Gamma, Demura, IC algorithms or the like, and the above algorithms can refer to the existing implementation methods, so it will not be described herein.

Figure 6:
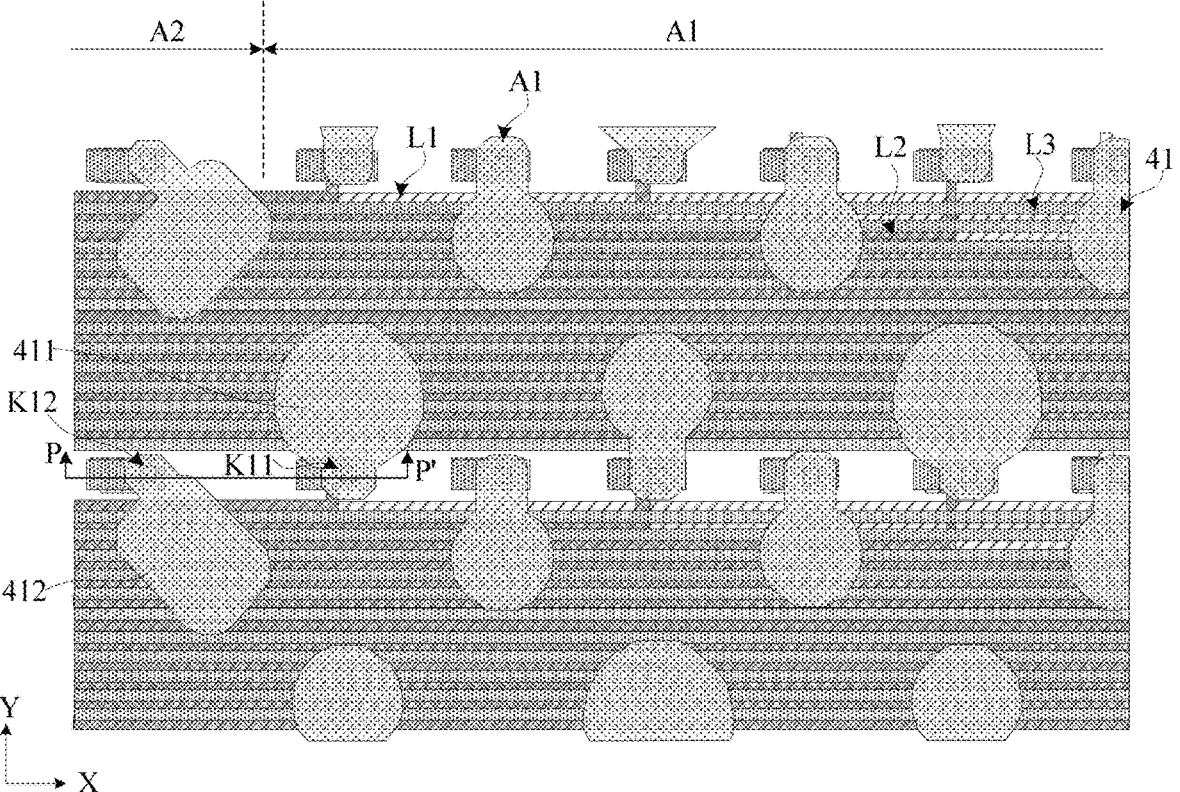
FIG. 6 is a partial schematic top diagram of a display substrate according to at least one embodiment of the present disclosure.
Figure 7:
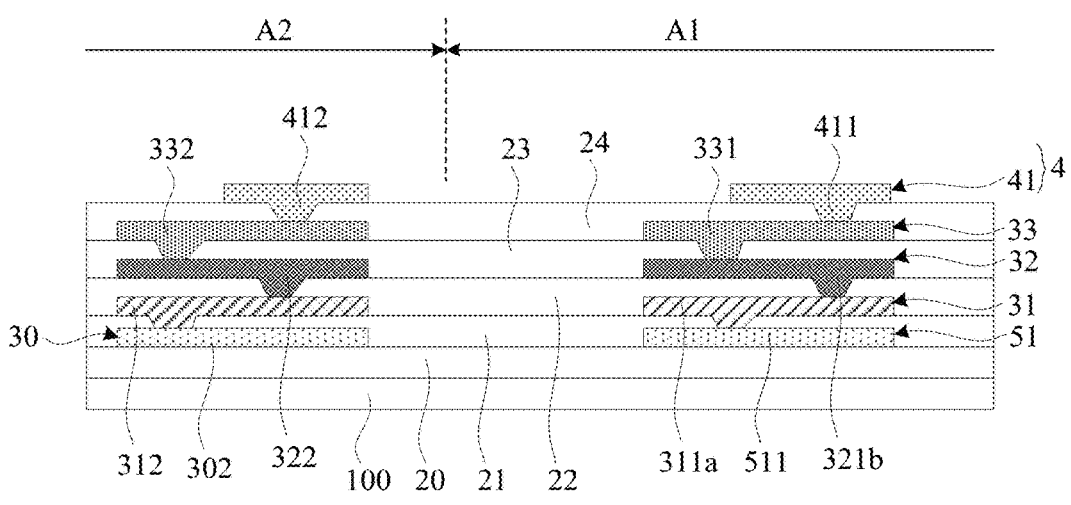
FIG. 7 is a partial cross sectional diagram taken along a direction P-P' in FIG. 6.
Figure 8A:
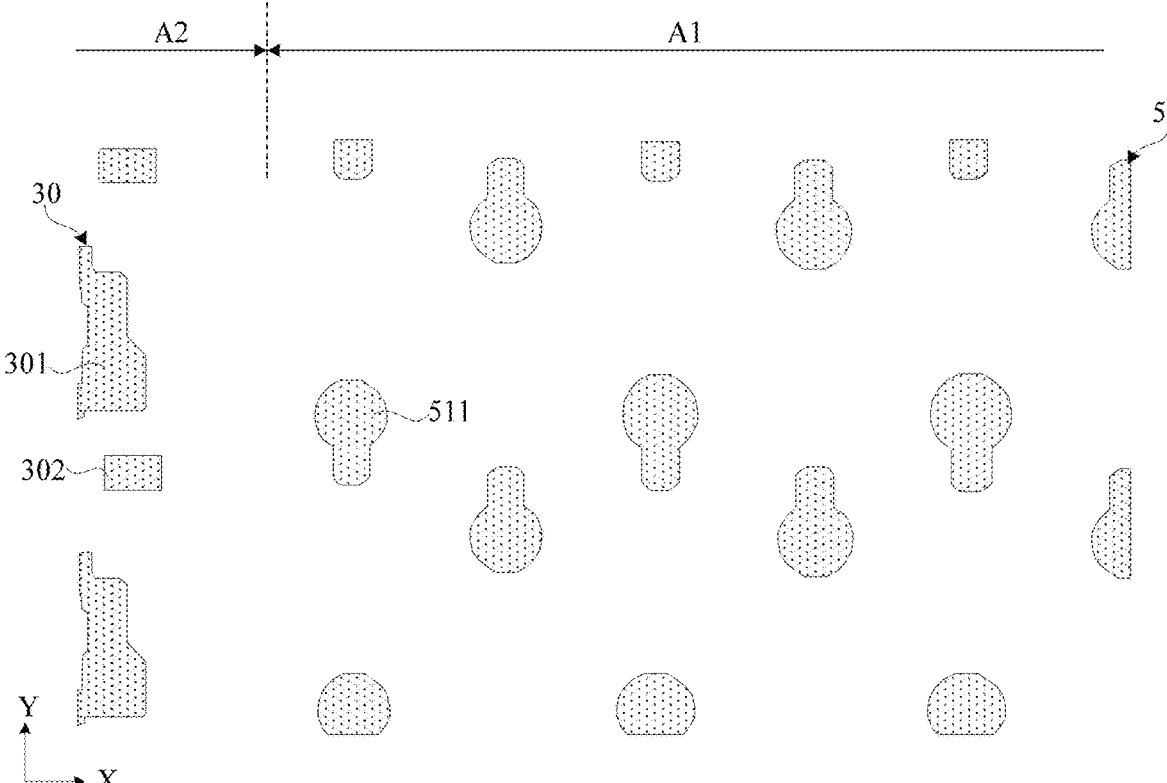
FIG. 8A is a partial schematic top diagram of a display substrate after a second source-drain metal layer and a capacitance compensation layer are formed in FIG. 6.
Figures 8B, 8C:
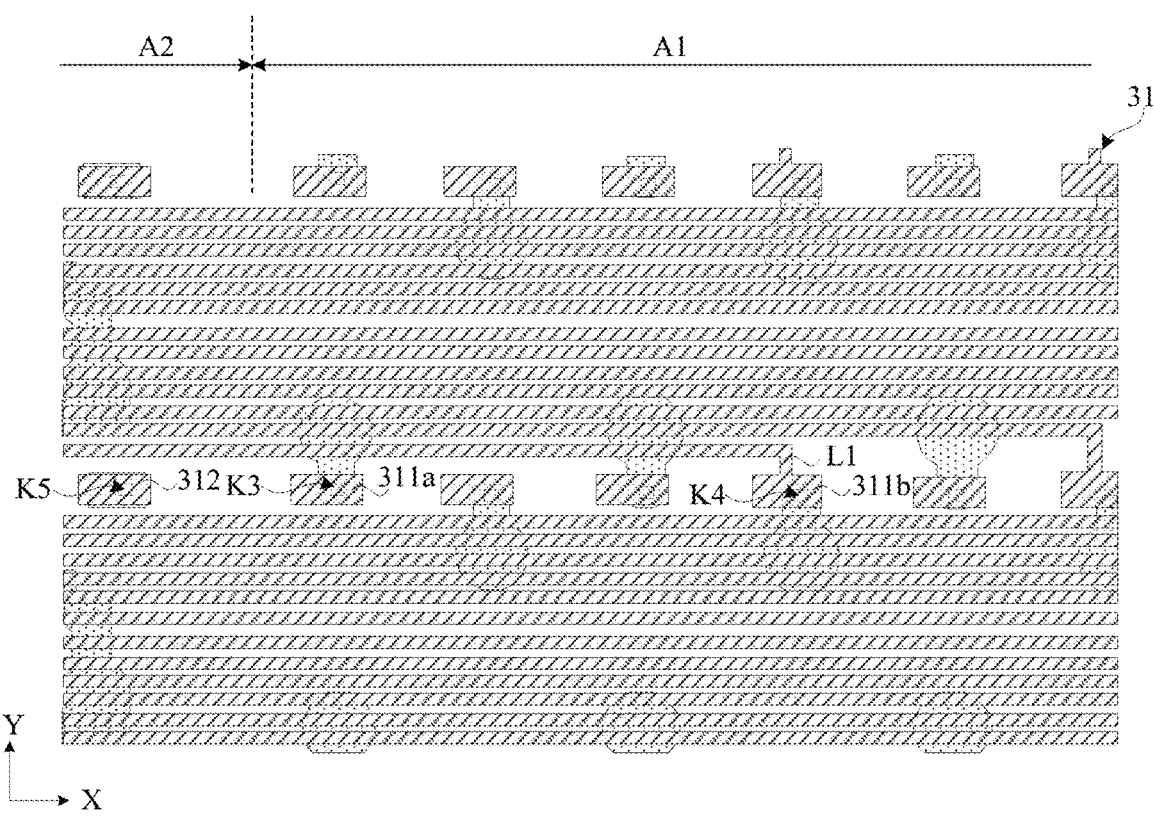
FIG. 8B is a partial schematic top diagram of a display substrate after a first transparent conductive layer is formed in FIG. 6.
FIG. 8C is a partial schematic top diagram of a display substrate after a second transparent conductive layer is formed in FIG. 6.
Figure 8D:
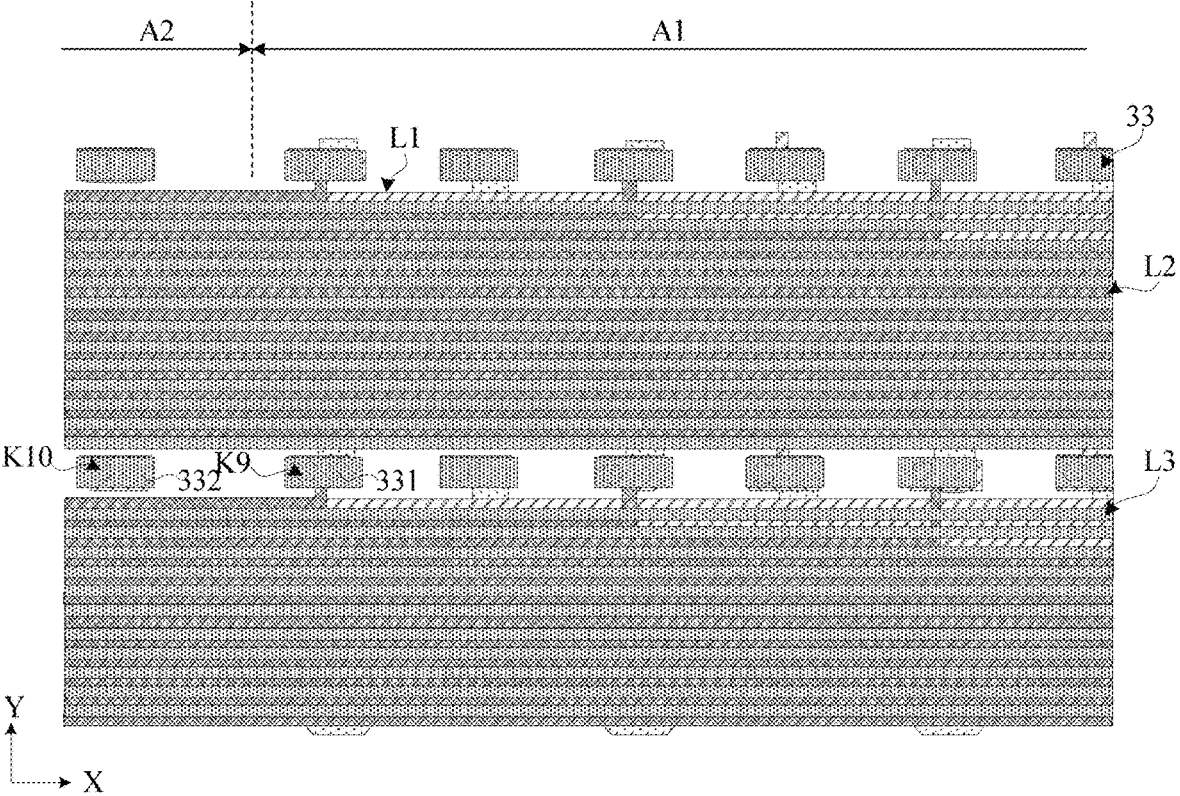
FIG. 8D is a partial schematic top diagram of a display substrate after a third transparent conductive layer is formed in FIG. 6.

FIG. 6 is a partial schematic top diagram of a display substrate according to at least one embodiment of the present disclosure. FIG. 7 is a partial cross sectional diagram taken along a direction P-P' in FIG. 6. FIG. 8A is a partial schematic top diagram of a display substrate after a second source-drain metal layer and a capacitance compensation layer are formed in FIG. 6. FIG. 8B is a partial schematic top diagram of a display substrate after a first transparent conductive layer is formed in FIG. 6. FIG. 8C is a partial schematic top diagram of a display substrate after a second transparent conductive layer is formed in FIG. 6. FIG. 8D is a partial schematic top diagram of a display substrate after a third transparent conductive layer is formed in FIG. 6.

In some exemplary implementations, as shown in FIG. 6 to FIG. 8D, in a direction perpendicular to the display substrate, the display substrate of the first display region A1 may include a base substrate 100, and a circuit structure layer 20, a capacitance compensation layer 51, a first transparent conductive layer 31, a second transparent conductive layer 32, a third transparent conductive layer 33, and a light emitting structure layer 4, provided on the base substrate 100; the display substrate of the second display region A2 may include a base substrate 100, and a circuit structure layer 20, a second source-drain metal layer 30, a first transparent conductive layer 31, a second transparent conductive layer 32, a third transparent conductive layer 33, and a light emitting structure layer 4, provided on the base substrate 100. A first planarization layer 21 may be provided between the second source-drain metal layer 30 and the first transparent conductive layer 31, and between the capacitance compensation layer 51 and the first transparent conductive layer 31; a second planarization layer 22 may be provided between the first transparent conductive layer 31 and the second transparent conductive layer 32; a third planarization layer 23 may be provided between the second transparent conductive layer 32 and the third transparent conductive layer 33; a fourth planarization layer 24 may be provided between the third transparent conductive layer 33 and the light emitting structure layer. The light emitting structure layer 4 may include an anode layer 41, a pixel define layer, an organic light emitting layer, and a cathode layer. The first planarization layer to the fourth planarization layer may be made of an organic material. However, the embodiment is not limited thereto. In other examples, the display substrate may include one transparent conductive layer or two transparent conductive layers.

Figure 9:
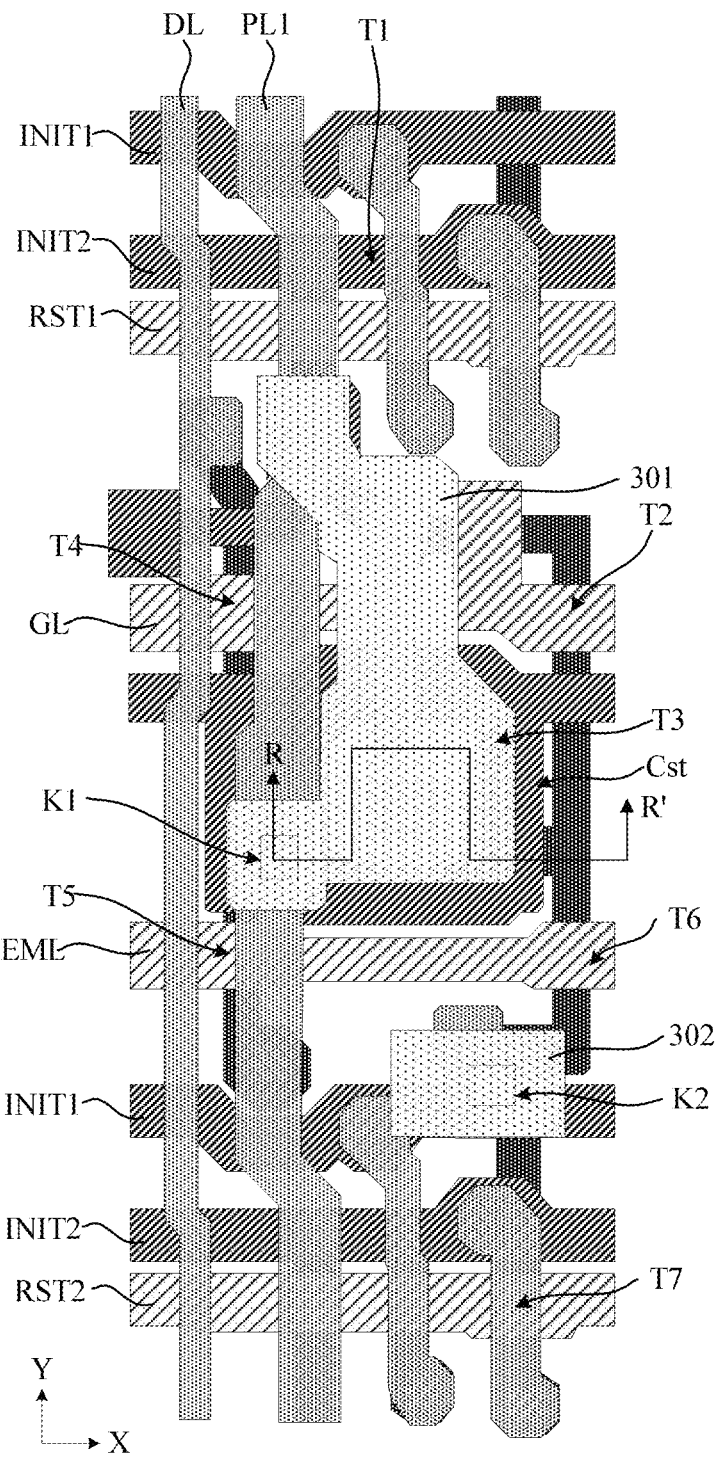
FIG. 9 is a schematic top diagram of a circuit structure layer of a second display region according to at least one embodiment of the present disclosure.
Figure 10:
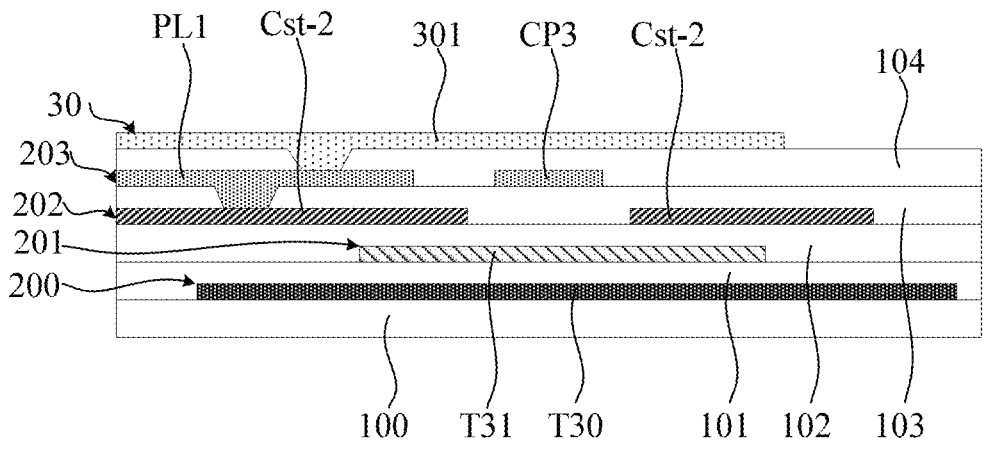
FIG. 10 is a partial cross sectional diagram taken along a direction R-R' in FIG. 9.
Figure 11A:
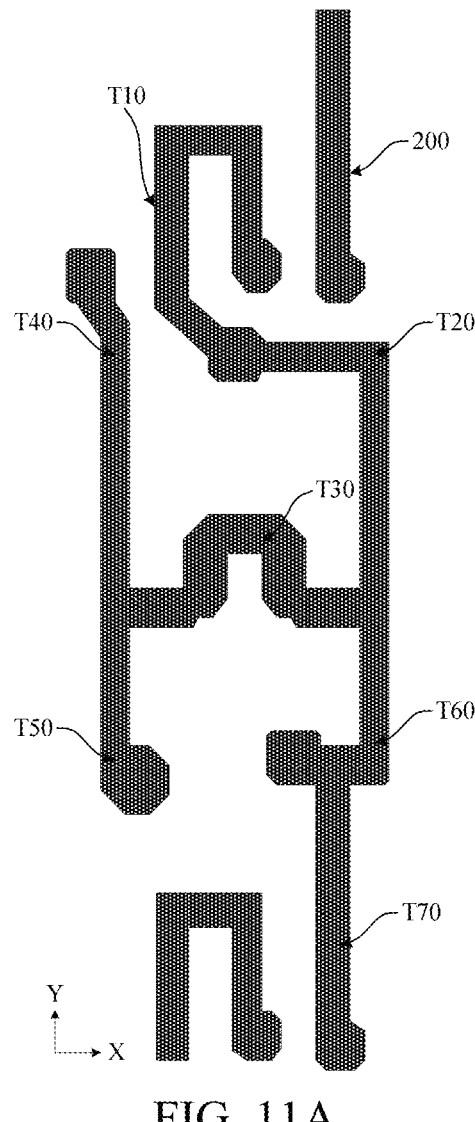
FIG. 11A is a schematic top diagram of a display substrate after a semiconductor layer is formed in FIG. 9.
Figure 11B:
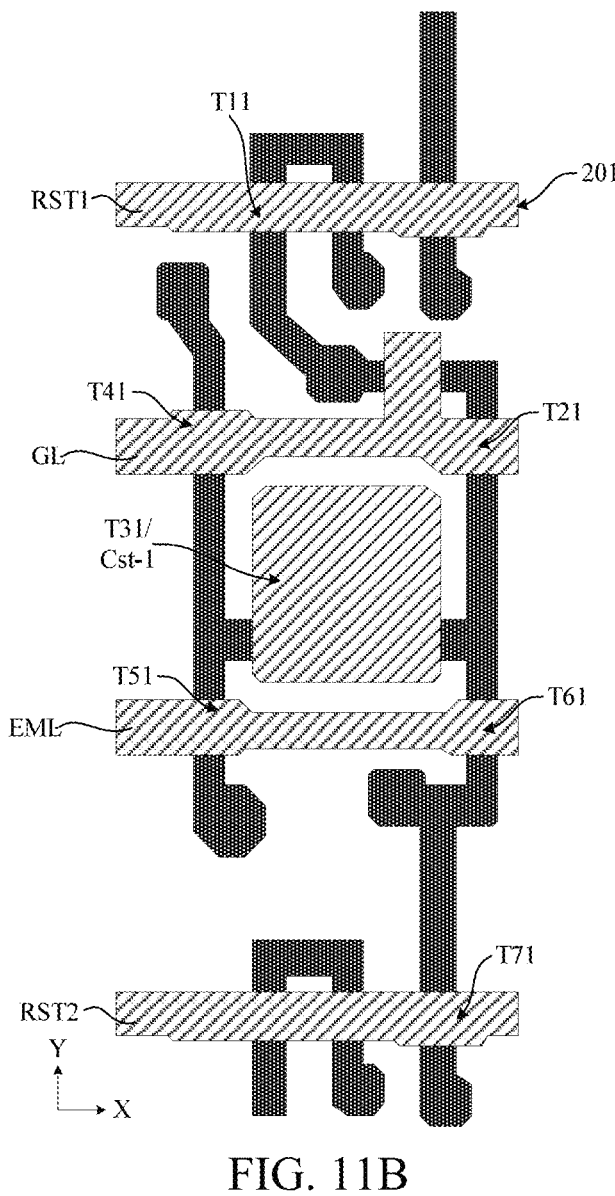
FIG. 11B is a schematic top diagram of a display substrate after a first gate metal layer is formed in FIG. 9.
Figure 11C:
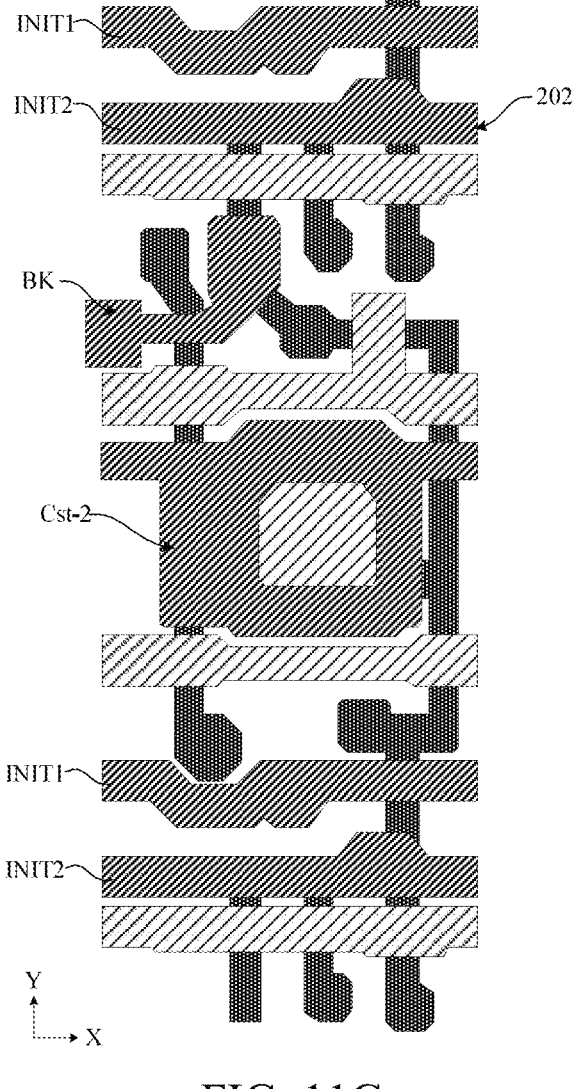
FIG. 11C is a schematic top diagram of a display substrate after a second gate metal layer is formed in FIG. 9.
Figure 11D:
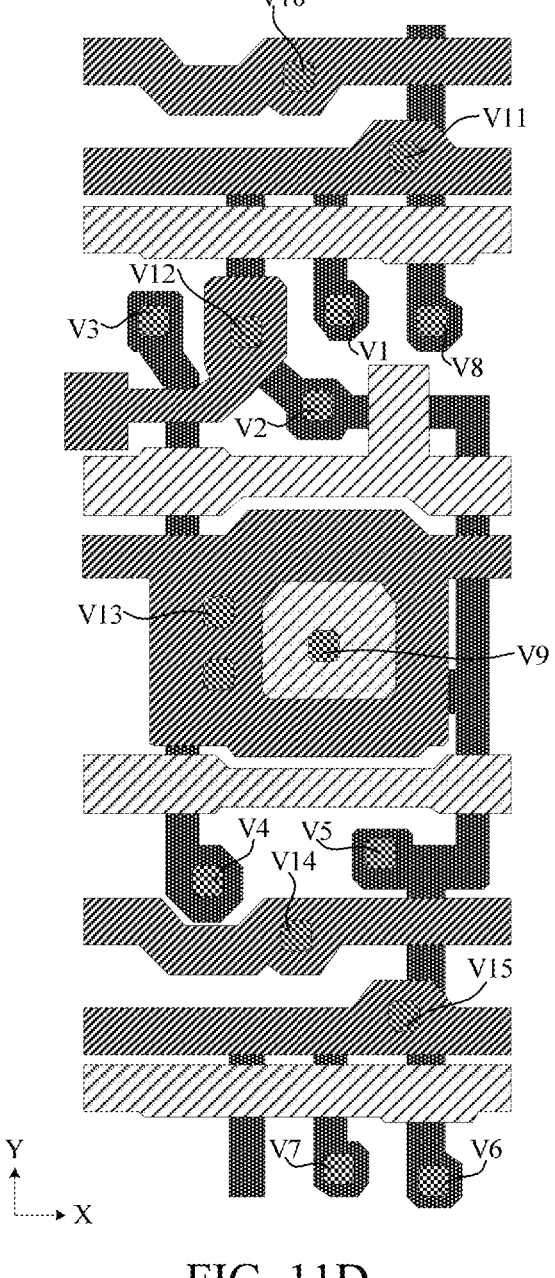
FIG. 11D is a schematic top diagram of a display substrate after a third insulation layer is formed in FIG. 9.
Figure 11E:
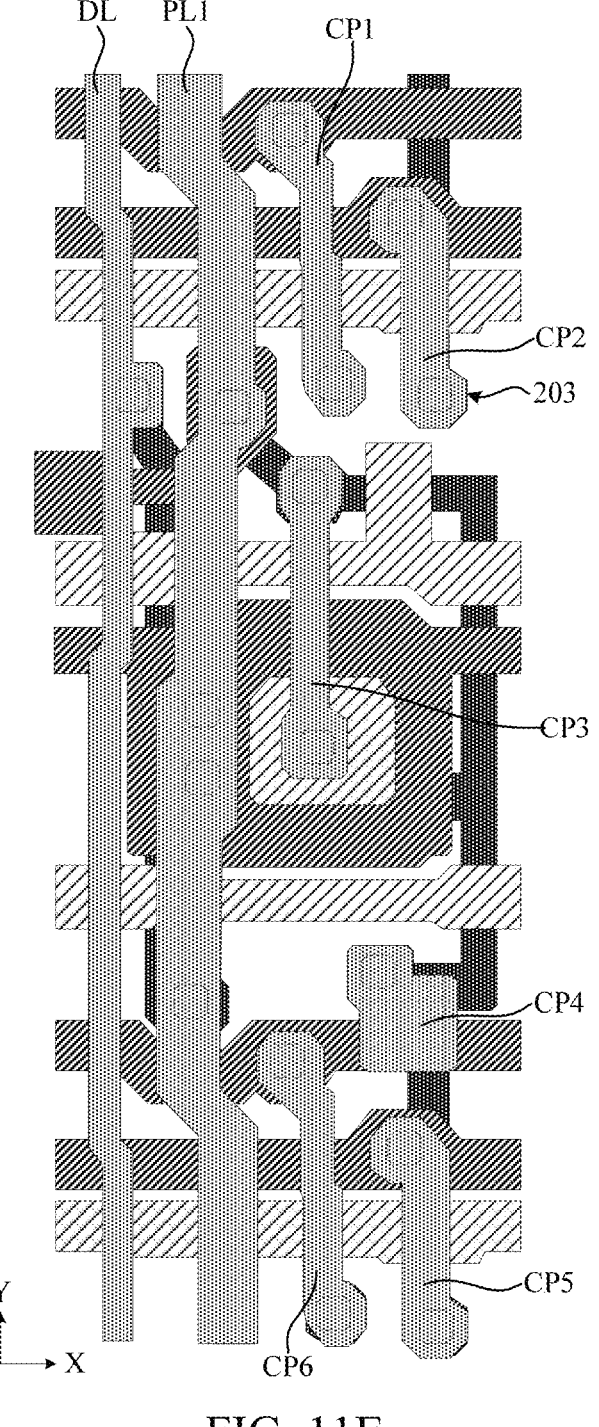
FIG. 11E is a schematic top diagram of a display substrate after a first source-drain metal layer is formed in FIG. 9.

FIG. 9 is a schematic top diagram of a circuit structure layer of a second display region according to at least one embodiment of the present disclosure. FIG. 10 is a partial cross sectional diagram taken along a direction R-R' in FIG. 9. FIG. 11A is a schematic top diagram of a display substrate after a semiconductor layer is formed in FIG. 9. FIG. 11B is a schematic top diagram of a display substrate after a first gate metal layer is formed in FIG. 9. FIG. 11C is a schematic top diagram of a display substrate after a second gate metal layer is formed in FIG. 9. FIG. 11D is a schematic top diagram of a display substrate after a third insulation layer is formed in FIG. 9. FIG. 11E is a schematic top diagram of a display substrate after a first source-drain metal layer is formed in FIG. 9.

In some exemplary implementations, as shown in FIG. 9 and FIG. 10, the circuit structure layer 20 of the second display region A2 may include a semiconductor layer 200, a first insulation layer 101, a first gate metal layer 201, a second insulation layer 102, a second gate metal layer 202, a third insulation layer 103, a first source-drain metal layer 203, and a fourth insulation layer 104 that are sequentially provided on the base substrate 100. The circuit structure layer 20 of the first display region A1 may include: the first insulation layer 101, the second insulation layer 102, the third insulation layer 103, and the fourth insulation layer 104 that are sequentially stacked on the base substrate 100. In some examples, the first insulation layer 101 to the fourth insulation layer 104 may be an inorganic material layer, or the first insulation layer 101 to the third insulation layer 103 may be an inorganic material layer, and the fourth insulation layer 104 may be an organic material layer. However, the embodiment is not limited thereto.

In some exemplary implementations, as shown in FIG. 6 to FIG. 8A, the capacitance compensation layer 51 of the first display region A1 may include multiple compensation capacitance electrode plates 511. The multiple compensation capacitance electrode plates 511 may be electrically connected with the anodes 411 of the multiple first light emitting elements of the anode layer 41 of the first display region A1 in a one-to-one correspondence. An orthographic projection of the anode 411 of the first light emitting element of the first display region A1 on the base substrate 100 may cover an orthographic projection of the corresponding electrically connected compensation capacitance electrode plate 511 on the base substrate 100. In some examples, the morphologies of the orthographic projections of the anode 411 of the first light emitting element and the compensation capacitance electrode plate 511 electrically connected thereto on the base substrate may be substantially the same. However, the embodiment is not limited thereto.

In some exemplary implementations, as shown in FIG. 6 to FIG. 8A, the capacitance compensation layer 51 and the second source-drain metal layer 30 of the second display region A2 may be of a same layer structure. The second source-drain metal layer 30 of the second display region A2 may include a shielding electrode 301 and a seventh connection electrode 302. The shielding electrode 301 may be configured to cover the first node N1 of the pixel circuit of the second display region A2 to reduce crosstalk of the transparent conductive layer to the first node N1. The seventh connection electrode 302 may be configured to be electrically connected with a fourth node N4 of the pixel circuit of the second display region A2.

In some exemplary implementations, as shown in FIG. 6 to FIG. 8B, the first transparent conductive layer 31 may include multiple first transparent conductive lines L1, multiple first anode connection electrodes 311*a* and 311*b*, and multiple second anode connection electrodes 312. The multiple first transparent conductive lines L1 may extend from the second display region A2 to the first display region A1. The multiple first anode connection electrodes 311*a* and 311*b* may be located in the first display region A1, and the multiple second anode connection electrodes 312 may be located in the second display region A2. One of the first anode connection electrodes 311*b* and one of the first transparent conductive lines L1 may be electrically connected, for example may be in an integral structure. As shown in FIG. 6 to FIG. 8C, the second transparent conductive layer 32 may include multiple second transparent conductive lines L2, multiple third anode connection electrodes 321*a* and 321*b*, and multiple fourth anode connection electrodes 322. The multiple second transparent conductive lines L2 may extend from the second display region A2 to the first display region A1. The multiple third anode connection electrodes 321*a* and 321*b* may be located in the first display region A1, and the multiple fourth anode connection electrodes 322 may be located in the second display region A2. Herein, one of the third anode connection electrodes 321*b* and one of the second transparent conductive lines L2 may be electrically connected, for example may be in an integral structure. As shown in FIG. 6 to FIG. 8D, the third transparent conductive layer 32 may include multiple third transparent conductive lines L3, multiple fifth anode connection electrodes 331, and multiple sixth anode connection electrodes 332. The multiple third transparent conductive lines L3 may extend from the second display region A2 to the first display region A1. The multiple fifth anode connection electrodes 331 may be located in the first display region A1 and, the multiple sixth anode connection electrodes 332 may be located in the second display region A2. The third transparent conductive line L3 may be electrically connected with the anode 411 of the first light emitting element 41 through a fifth anode connection electrode. One of third transparent conductive lines L3 and one of fifth anode connection electrodes may be in an integral structure.

In some exemplary implementations, an orthographic projection of the second transparent conductive line L2 may be overlapped with an orthographic projection of the first transparent conductive line L1 on the base substrate, and an orthographic projection of the third transparent conductive line L3 on the base substrate may be overlapped with both the orthographic projection of the first transparent conductive line L1 and the orthographic projection of the second transparent conductive line L2 on the base substrate. For example, an orthographic projection of a portion of the first transparent conductive line L1 extending along the first direction X on the base substrate may cover an orthographic projection of a portion of the second transparent conductive line L2 extending along the first direction X on the base substrate, and an orthographic projection of a portion of the third transparent conductive line L3 extending along the first direction X on the base substrate may be located between an orthographic projection of a portion of the first transparent conductive line L1 and an orthographic projection of a portion of the second transparent conductive line L2 extending along the first direction X on the base substrate. However, the embodiment is not limited thereto.

In some exemplary embodiments, the orthographic projection of the compensation capacitor plate 511 on the substrate may be overlapped with the orthographic projections of multiple transparent conductive lines on the substrate. For example, the compensation capacitor substrate 511 may be overlapped with the orthographic projections of three first transparent conductive lines L1, three second transparent conductive lines L2, and three third transparent conductive lines L3 on the base substrate. However, the embodiment is not limited thereto.

In some exemplary implementations, as shown in FIG. 6 to FIG. 8D, the anode layer 41 may include an anode 411 of a first light emitting element located in a first display region A1, and an anode 412 of a second light emitting element located in a second display region A2. In some examples, the anode area of the first light emitting element may be smaller than the anode area of the second light emitting element that emits light of a same color to improve the light transmittance of the first display region. For example, the anode of the first light emitting element can be designed with corner smoothing to reduce the diffraction of the camera under the first display region of the display substrate during shooting, thereby improving the shooting effect.

In some exemplary implementations, as shown in FIG. 6 to FIG. 8D, the anode 411 of the first display region A1 may be electrically connected with the fifth anode connection electrode 331 of the third transparent conductive layer 33 through a via (e.g., an eleventh via K11) opened on the fourth planarization layer 24. The fifth anode connection electrode 331 may be electrically connected with the third anode connection electrode 321b of the second transparent conductive layer 32 through a via (e.g. a ninth via K9) opened on the third planarization layer 23. The third anode connection electrode 321b may be electrically connected with the first anode connection electrode 311a of the first transparent conductive layer 31 through a via (e.g., a seventh via K7) opened on the second planarization layer 22, and the first anode connection electrode 311a may be electrically connected with a compensation capacitance electrode plate 511 of the capacitance compensation layer 51 through a via (e.g., a third via K3) opened on the first planarization layer 21. The third anode connection electrode 321a may be electrically connected with the first anode connection electrode 311b of the first transparent conductive layer 31 through a via (e.g., a sixth via K6) opened on the second planarization layer 22, and the first transparent conductive line L1 may be electrically connected with another compensation capacitance electrode plate 511 of the capacitance compensation layer 51 through a via (e.g., a fourth via K4) opened on the first planarization layer 21. In this example, the anode 411 of the first light emitting element of the first display region A1 may be electrically connected with the compensation capacitance electrode plate 511 through the anode connection electrodes located at three transparent conductive layers. However, the embodiment is not limited thereto. In other examples, the anode of the first light emitting element of the first display region A1 may be directly electrically connected with an anode connection electrode of a certain transparent conductive layer, and then the anode connection electrode is directly electrically connected with a corresponding compensation capacitance electrode plate.

In some exemplary implementations, as shown in FIG. 6 to FIG. 8A, the anode 412 of the second display region A2 may be electrically connected with the sixth anode connection electrode 332 of the third transparent conductive layer 33 through a via (e.g., a twelfth via K12) opened on the fourth planarization layer 24. The sixth anode connection electrode 332 may be electrically connected with the fourth anode connection electrode 322 of the second transparent conductive layer 32 through a via (e.g. a tenth via K10) opened on the third planarization layer 23. The fourth anode connection electrode 322 may be electrically connected with the second anode connection electrode 312 of the first transparent conductive layer 31 through a via (e.g. an eighth via K8) opened on the second planarization layer 22. The second anode connection electrode 312 may be electrically connected with the seventh connection electrode 302 of the second source-drain metal layer 30 through a via (e.g., a fifth via K5) opened on the first planarization layer 21. In this example, an anode 412 of the second light emitting element of the second display region A2 may be electrically connected with a second pixel circuit through the connection electrodes located at the three transparent conductive layers and the second source-drain metal layer. However, the embodiment is not limited thereto. In other examples, the anode of the second light emitting element of the second display region A2 may be electrically connected with an anode connection electrode of a certain transparent conductive layer, then the anode connection electrode of the certain transparent conductive layer is directly electrically connected with the second pixel circuit. As another example, the anode of the second light emitting element of the second display region A2 may be directly electrically connected with the second pixel circuit.

In some examples, as shown in FIG. 4, the number of film layers of transparent conductive layers covered by the anode of the first light emitting element close to the edge of the first display region A1 is relatively large (e.g. three transparent conductive layers), while the number of film layers of transparent conductive layers covered by the anode of the first light emitting element close to the center of the first display region A1 is relatively small (e.g. one transparent conductive layer). The sizes of the compensation capacitance electrode plates provided in the first display region may be substantially the same. Since the number of film layers of the transparent conductive layer at the edge position of the first display region A1 is relatively large, the capacitance between the compensation capacitance electrode plate electrically connected with the anode of the first light emitting element close to the edge of the first display region A1 and the multiple transparent conductive layers is also increased, thereby generating a relatively large compensation capacitance. The compensation capacitance generated by the first light emitting element close to the edge of the first display region A1 through the compensation capacitance electrode plate may be greater than the compensation capacitance generated by the first light emitting element close to the center of the first display region A1 through the compensation capacitance electrode plate. In some examples, the compensation capacitance generated by each first light emitting element through the compensation capacitance electrode plate may be about 100 fF to 180 fF, for example, may be about 120 fF to 180 fF. However, the embodiment is not limited thereto. In other examples, the compensation capacitance electrode plates of different sizes may be provided, and a size of the compensation capacitance electrode plate electrically connected with the first light emitting element close to the center of the first display region may be smaller than a size of the compensation capacitance electrode plate electrically connected with the first light emitting element away from the center of the first display region, a compensation capacitance generated by the first light emitting element close to the center of the first display region through the compensation capacitance electrode plate may be smaller than a compensation capacitance generated by the first light emitting element away from the center of the first display region through the compensation capacitance electrode plate.

The structure of the display substrate will be described below through an example of a preparation process of the display substrate. The "patterning process" mentioned in the embodiments of the present disclosure includes processes, such as photoresist coating, mask exposure, development, etching and photoresist stripping for metal materials, inorganic materials or transparent conductive materials, and includes organic material coating, mask exposure and development for organic materials. Deposition may be any one or more of sputtering, evaporation, and chemical vapor deposition, coating may be any one or more of spray coating, spin coating, and ink-jet printing, and etching may be any one or more of dry etching and wet etching, which is not limited in the present disclosure. A "thin film" refers to a layer of thin film formed by a material on a base substrate through deposition, coating, or other processes. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern".

In some exemplary implementations, a preparation process of a display substrate may include following operations. A circuit structure layer of the second display region A2 is described by taking a pixel circuit of the second display region A2 as an example. A circuit structure of the pixel circuit may be shown in FIG. 2.

(1) A Base Substrate is Provided.

In some exemplary implementations, the base substrate 100 may be a rigid base substrate, e.g., a glass base substrate. However, the embodiment is not limited thereto. For example, the base substrate 100 may be a flexible base substrate.

(2) A Semiconductor Layer 200 is Formed.

In some exemplary implementations, a semiconductor thin film is deposited on a base substrate 100 of a second display region A2, and the semiconductor thin film is patterned through a patterning process to form the semiconductor layer 200 at the second display region A2. As shown in FIG. 9 and FIG. 11A, the semiconductor layer 200 may include active layers of multiple transistors of a pixel circuit (e.g., including an active layer T10 of a first reset transistor T1, an active layer T20 of a threshold compensation transistor T2, an active layer T30 of a driving transistor T3, an active layer T40 of a data writing transistor T4, an active layer T50 of a first light emitting control transistor T5, an active layer T60 of a second light emitting control transistor T6, and an active layer T70 of a second reset transistor T7). The active layers of seven transistors of a pixel circuit may be an integral structure connected with each other.

In some exemplary implementations, a material of the semiconductor layer 200 may include, for example, polycrystalline silicon. An active layer may include at least one channel region and multiple doped regions. The channel region may not be doped with an impurity, and has characteristics of a semiconductor. The multiple doped regions may be on two sides of the channel region and doped with impurities, and thus have conductivity. The impurities may be changed according to a type of a transistor. In some examples, a doped region of the active layer may be interpreted as a source or a drain of a transistor. A part of the active layer between the transistors may be interpreted as a wiring doped with an impurity, and may be used for electrically connecting the transistors.

(3) A First Gate Metal Layer is Formed.

In some exemplary implementations, a first insulation thin film and a first metal thin film are sequentially deposited on the base substrate 100 where the aforementioned structure is formed, and the first metal thin film is patterned through a patterning process to form a first insulation layer 101 covering the semiconductor layer 200 and the first gate metal layer 201 provided on the first insulation layer 101 of the second display region A2. As shown in FIG. 9 and FIG. 11B, the first gate metal layer 201 may include gates of multiple transistors of a pixel circuit, and a first capacitance electrode plate Cst-1 of a storage capacitor Cst, a first reset control line RST1, a second reset control line RST2, a scan line GL, and a light emitting control line EML. The first reset control line RST1 and a gate T11 of a first reset transistor T1 may be in an integral structure. The scan line GL, a gate T41 of a data writing transistor T4, and a gate T21 of a threshold compensation transistor T2 may be in an integral structure. A gate T31 of a driving transistor T3 and the first capacitance electrode plate Cst-1 of the storage capacitor Cst may be in an integral structure. The light emitting control line EML, a gate T51 of a first light emitting control transistor T5, and a gate T61 of a second light emitting control transistor T61 may be in an integral structure. The second reset control line RST2 and a gate T71 of a second reset transistor T7 may be in an integral structure.

(4) A Second Gate Metal Layer is Formed.

In some exemplary implementations, a second insulation thin film and a second metal thin film are sequentially deposited on the base substrate 100 where the aforementioned structures are formed, and the second metal thin film is patterned through a patterning process to form a second insulation layer 102 covering the first gate metal layer 201 and a second gate metal layer 202 provided on the second insulation layer 102 of the second display region A2. As shown in FIG. 9 and FIG. 11C, the second gate metal layer 202 may include a second capacitance electrode plate Cst-2 of a storage capacitor Cst of a pixel circuit, a shielding electrode BK, a first initial signal line INIT1, and a second initial signal line INIT2. The shielding electrode BK may be configured to shield an influence of a data voltage jump on a key node, thus avoiding an influence of the data voltage jump on a potential of the key node of a pixel circuit, and improving a display effect.

(5) A Third Insulation Layer and a First Source-Drain Metal Layer are Formed.

In some exemplary implementations, a third insulation thin film is deposited on the base substrate 100 on which the aforementioned structures are formed to form a third insulation layer through a patterning process. The third insulation layer 103 is provided with multiple pixel vias. Subsequently a third metal thin film is deposited and patterned by a patterning process to form a first source-drain metal layer 203 disposed on the third insulation layer 103 of the second display region A2.

In some examples, as shown in FIG. 9 and FIG. 11D, the third insulation layer 103 of the second display region A2 is provided with multiple pixel vias, which may include, for example, a first pixel via V1 to a fifteen pixel via V15. The third insulation layer 103, the second insulation layer 102, and the first insulation layer 101 within the first pixel via V1 to the eighth pixel via V8 are removed to expose a surface of the semiconductor layer 200. The third insulation layer 103 and the second insulation layer 102 within the ninth pixel via V9 are removed to expose a surface of the first gate metal layer 201. The third insulation layer 103 within the tenth pixel via V10 to the fifteenth pixel via V15 is removed to expose a surface of the second gate metal layer 202.

In some examples, as shown in FIG. 9 and FIG. 11E, the first source-drain metal layer 203 may include a data line DL, a first power supply line PL1, and multiple connection electrodes (e.g., a first connection electrode CP1 to a sixth connection electrode CP6). The first connection electrode CP1 may be electrically connected with a first doped region of an active layer T10 of the first reset transistor T1 through a first pixel via V1, and may also be electrically connected with a first initial signal line INIT1 through a tenth pixel via V10. The second connection electrode CP2 may be electrically connected with a first doped region of an active layer of a second reset transistor of a upper row of pixel circuits through a eighth pixel via V8, and may also be electrically connected with a second initial signal line INIT2 through an eleventh pixel via V11. The third connection electrode CP3 may be electrically connected with a gate T31 of the driving transistor T3 through a ninth pixel via V9, and may also be electrically connected with a first doped region of an active layer T20 of a threshold compensation transistor T2 through a second pixel via V2. The fourth connection electrode CP4 may be electrically connected with a second doped region of an active layer T60 of a second light emitting control transistor T6 through a fifth pixel via V5. The fifth connection electrode CP5 may be electrically connected with a first doped region of an active layer T70 of a second reset transistor T7 through a sixth pixel via V6, and may also be electrically connected with another second initial signal line INIT2 through a fifteenth pixel via V15. The sixth connection electrode CP6 may be electrically connected with a first doped region of an active layer of a first reset transistor of a lower row of pixel circuits through a seventh pixel via V7, and may also be electrically connected with another first initial signal line INIT1 through a fourteenth via V14. The data line DL may be electrically connected with a first doped region of an active layer T40 of the data writing transistor T4 through the third pixel via V3. The first power line PL1 may be electrically connected with a shielding electrode BK through the twelfth pixel via V12, and may also be electrically connected with a first doped region of an active layer T50 of a first light emitting control transistor T5 through a fourth pixel via V4, and may be electrically connected with a second capacitance electrode plate Cst-2 of a storage capacitor Cst through two thirteenth pixel vias V13 arranged vertically.

In some exemplary implementations, a fourth insulation thin film is deposited on the base substrate 100 on which the aforementioned structures are formed to form a fourth insulation layer 104 through a patterning process. The fourth insulation layer 104 of the second display region A2 is provided with multiple vias (including, for example, a first via K1 and a second via K2) exposing a surface of a first source-drain metal layer 203.

So far, preparation of the circuit structure layer of the second display region A2 is completed. A first display region A1 may include the base substrate 100, and the first insulation layer 101, the second insulation layer 102, the third insulation layer 103, and the fourth insulation layer 104 that are stacked on the base substrate 100.

(6) A Second Source-Drain Metal Layer and a Capacitance Compensation Layer are Formed.

In some exemplary implementations, a fourth metal film is deposited on the base substrate 100 on which the aforementioned structures are formed, and the fourth metal film is patterned by a patterning process to form a second source-drain metal layer 30 provided on the fourth insulation layer 104 of the second display region A2 and a capacitance compensation layer 51 provided on the fourth insulation layer 104 of the first display region A1, as shown in FIG. 9 and FIG. 8A. In some examples, as shown in FIG. 9, the second source-drain metal layer 30 may include a shielding electrode 301 and a seventh connection electrode 302. The shielding electrode 301 may be electrically connected with the first power supply line PL1 through the first via K1. The third connection electrode 302 may be electrically connected with the fourth connection electrode CP4 through the second via K2. In this example, the shielding electrode 301 may have an irregular shape and may be configured to cover the first node N1 of the pixel circuit to reduce crosstalk of the transparent conductive layer to the first node N1. However, the embodiment is not limited thereto. In other examples, the shielding electrode 301 may have a regular shape such as a circle, or a pentagonal, or hexagonal, or the like shape. The structure of the capacitance compensation layer 51 is described previously.

(7) A First Planarization Layer and a First Transparent Conductive Layer are Formed.

In some exemplary implementations, a first planarization thin film is coated on the base substrate 100 on which the aforementioned structures are formed, and the first planarization thin film is patterned through a patterning process to form the first planarization layer 21. Subsequently, a first transparent conductive thin film is deposited, and the first transparent conductive thin film is patterned through a patterning process to form the first transparent conductive layer 31 provided on the first planarization layer 21, as shown in FIG. 6 and FIG. 8B. In some examples, the first planarization layer 21 is provided with multiple vias (including, for example, a third via K3 and a fourth via K4 located in the first display region A1, and a fifth via K5 located in the second display region A2). For example, the first anode connection electrode 311a of the first transparent conductive layer 31 of the first display region A1 may be electrically connected with a compensation capacitance electrode plate through the third via K3, and the first transparent conductive line L1 may be electrically connected with another compensation capacitance electrode plate through a first anode connection electrode 311b and the fourth via K4. The second anode connection electrode 312 of the first transparent conductive layer 31 of the second display region A2 may be electrically connected with the seventh connection electrode 302 through the fifth via K5.

(8) A Second Planarization Layer and a Second Transparent Conductive Layer are Formed.

In some exemplary implementations, a second planarization thin film is coated on the base substrate 100 on which the aforementioned structures are formed, and the second planarization thin film is patterned through a patterning process to form the second planarization layer 22. Subsequently, a second transparent conductive thin film is deposited, and the second transparent conductive thin film is patterned through a patterning process to form the second transparent conductive layer 32 provided on the second planarization layer 22, as shown in FIG. 6 and FIG. 8C. In some examples, the second planarization layer 22 is provided with multiple vias (including, for example, a sixth via K6 and a seventh via K7 located in the first display region A1, and an eighth via K8 located in the second display region A2). For example, a third anode connection electrode 321a of the second transparent conductive layer 32 of the first display region A1 may be electrically connected with a first anode connection electrode 311b of the first transparent conductive layer 31 through the sixth via K6, and a second transparent conductive line L2 may be electrically connected with the first anode connection electrode 311a of the first transparent conductive layer 31 through the third anode connection electrode 321b and the seventh via K7. The fourth anode connection electrode 322 of the second transparent conductive layer 32 of the second display region A2 may be electrically connected with the second anode connection electrode 312 through the eighth via K8.

(9) A Third Planarization Layer and a Third Transparent Conductive Layer are Formed.

In some exemplary implementations, a third planarization thin film is coated on the base substrate 100 on which the aforementioned structures are formed, and the third planarization thin film is patterned through a patterning process to form the third planarization layer 23. Subsequently, a third transparent conductive thin film is deposited, and the third transparent conductive thin film is patterned through a patterning process to form the third transparent conductive layer provided on the third planarization layer 23, as shown in FIG. 6 and FIG. 8D. In some examples, the third planarization layer 22 is provided with multiple vias (including, for example, a ninth via K9 located in the first display region A1 and a tenth via K10 located in the second display region A2). For example, a fifth anode connection electrode 331 of the third transparent conductive layer 33 of the first display region A1 may be electrically connected with a third anode connection electrode 321b of the second transparent conductive layer 32 through the ninth via K9. A sixth anode connection electrode 332 of the third transparent conductive layer 33 of the second display region A2 may be electrically connected with a fourth anode connection electrode 322 through a tenth via K10.

(10) A Light Emitting Structure Layer is Formed.

In some exemplary implementations, a fourth planarization thin film is coated on the base substrate 100 on which the aforementioned structures are formed, and the fourth planarization thin film is patterned through a patterning process to form a fourth planarization layer 24. Subsequently, an anode conductive thin film is deposited, and the anode conductive thin film is patterned through a patterning process to form an anode layer 41 provided on the fourth planarization layer 24. Subsequently, a pixel definition thin film is coated on the base substrate on which the aforementioned structures are formed, and a Pixel Define Layer (PDL) is formed through masking, exposure, and development processes. The pixel define layer is provided with multiple pixel openings exposing the anode layer. Subsequently, an organic light emitting layer is formed in the aforementioned pixel openings, and the organic light emitting layer is connected with an anode. Then, a cathode thin film is deposited and patterned by a patterning process to form a cathode pattern. The cathode is electrically connected with the organic emitting layer and the second power line respectively. Then, an encapsulation layer is formed on the cathode. The encapsulation layer may include a stacked structure of an inorganic material/an organic material/an inorganic material.

In some exemplary implementations, the first gate metal layer 201, the second gate metal layer 202, a first source-drain metal layer 203, a second source-drain metal layer 30 and a capacitance compensation layer 51 may be made of a metal material, such as any one or more of argentum (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first transparent conductive layer 31 to the third transparent conductive layer 33 may be made of a transparent conductive material, such as indium tin oxide (ITO). The first insulation layer 101, the second insulation layer 102, the third insulation layer 103, and the fourth insulation layer 104 may be made of any one or more of Silicon Oxide (SiOx), Silicon Nitride (SiNx), and Silicon Oxynitride (SiON), and may be a single layer, a multi-layer, or a composite layer. The first planarization layer 21 to the fourth planarization layer 24 may be made of an organic material, such as polyimide, acrylic, or polyethylene terephthalate. The pixel define layer may be made of an organic material, such as polyimide, acrylic, or polyethylene terephthalate. The anode layer 41 may be made of a reflective material such as a metal, and the cathode may be made of a transparent conductive material. However, the embodiment is not limited thereto.

A structure and the preparation process of the display substrate of the embodiment are merely illustrative. In some exemplary implementations, a corresponding structure may be changed and a patterning process may be increased or decreased according to actual needs. The manufacturing process of the exemplary embodiment may be implemented using an existing mature manufacturing device, and may be compatible well with an existing preparation process, simple in process implementation, easy to implement, high in a production efficiency, low in a production cost, and high in a yield.

The present exemplary embodiment provides a display substrate, a capacitance compensation layer is provided on a side of the first light emitting element in the first display region A1 close to the base substrate, and an anode of the first light emitting element is electrically connected with the compensation capacitance electrode plate of the capacitance compensation layer, the anode capacitance of the first light emitting element in the first display region may be increased, thereby improving the situation that an anode capacitance difference of different first light emitting elements is too large and the situation that a first light emitting element cannot be turned on under a low gray scale, thereby improving a display effect of the first display region.

Figure 12A:
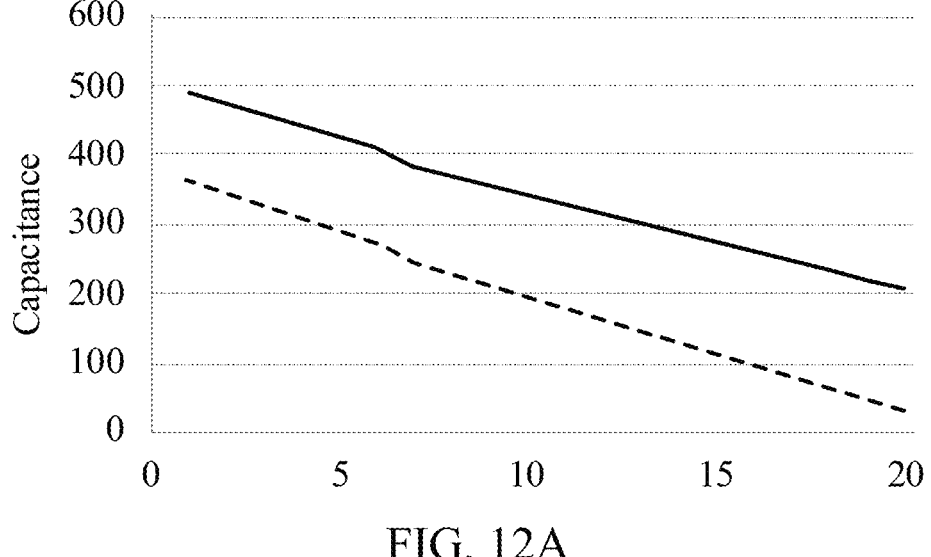
FIG. 12A is a schematic comparison diagram of an anode capacitance of a first light emitting element in a first display region of a display substrate before and after improvement according to at least one embodiment of the present disclosure.
Figure 12B:
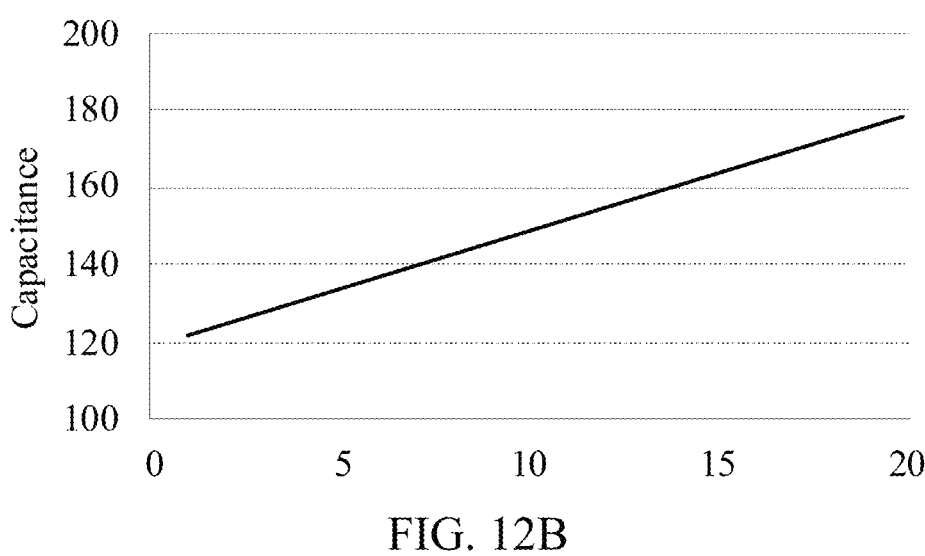
FIG. 12B shows an increased anode capacitance of a first light emitting element before and after improvement according to at least one embodiment of the present disclosure.

FIG. 12A is a schematic comparison diagram of an anode capacitance of a first light emitting element in a first display region of a display substrate before and after improvement according to at least one embodiment of the present disclosure. FIG. 12B shows an increased anode capacitance of a first light emitting element before and after improvement according to at least one embodiment of the present disclosure. The x-axis in FIG. 12A and FIG. 12B denotes a position of the first light emitting element in the first display region from a center to an edge of the first display region in the first direction X, and the y-axis denotes the capacitance, in unit of fF. In FIG. 12A, a thick solid line indicates a variation curve of an anode capacitance of a first light emitting element on a display substrate on which a capacitance compensation layer is provided, and a thick dashed line indicates a variation curve of an anode capacitance of a first light emitting element on a display substrate on which a capacitance compensation layer is not provided. As can be seen from FIG. 12A, the display substrate of the embodiment may reduce the anode capacitance difference between the first light emitting element close to the center of the first display region and the first light emitting element away from the center of the first display region, so that it may be beneficial to improve a low gray scale display defect (Mura) of the first display region. As can be seen in FIG. 12B, in the embodiment, in a direction from a center to an edge of the first display region, the compensation capacitance generated by the first light emitting element by connecting the compensation capacitance electrode plate is gradually increased, so that the anode capacitance of the multiple first light emitting elements in a direction from a center to an edge of the first display region is increased, to reduce the anode capacitance difference of the multiple first light emitting elements.

Figures 13, 14:
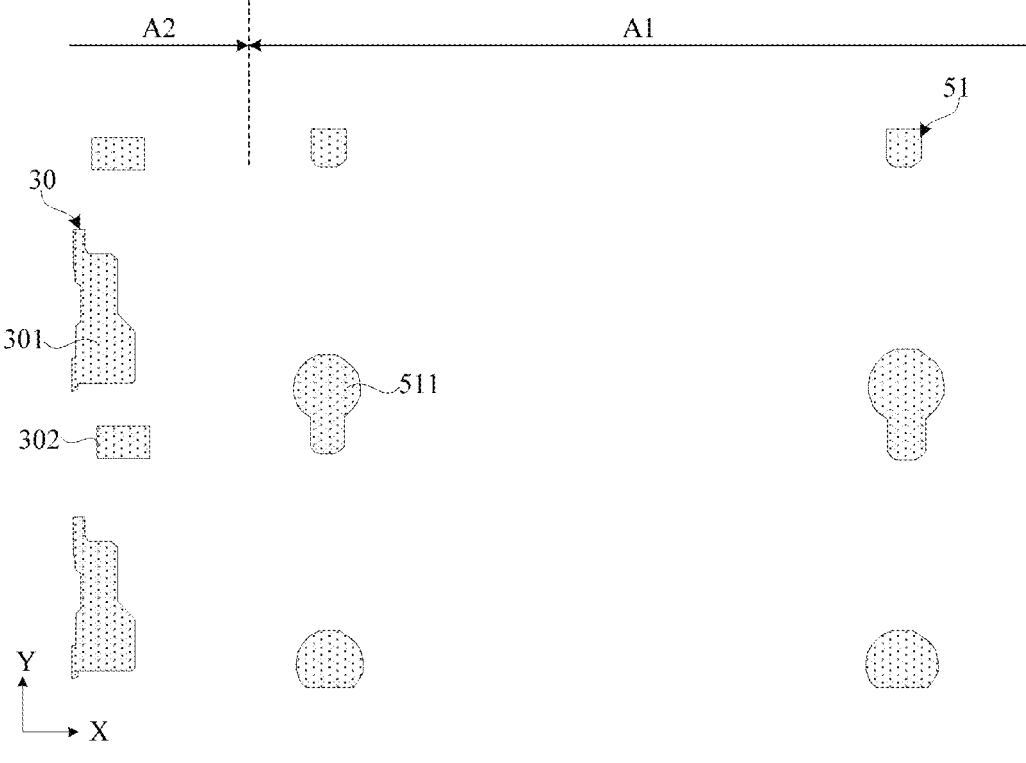
FIG. 13 is another partial schematic top diagram of a display substrate after a second source-drain metal layer and a capacitance compensation layer are formed according to at least one embodiment of the present disclosure.
FIG. 14 is another partial cross sectional schematic diagram of a display substrate according to at least one embodiment of the present disclosure.

FIG. 13 is another partial schematic top diagram of a display substrate after a second source-drain metal layer and a capacitance compensation layer are formed according to at least one embodiment of the present disclosure. In some exemplary implementations, multiple first light emitting elements of the first display region A1 may include multiple first light emitting elements that emit green light, multiple first light emitting elements that emit red light, and multiple first light emitting elements that emit blue light. As shown in FIG. 13, a compensation capacitance electrode plate 511 located below the multiple first light emitting elements that emit green light may be provided only in the capacitance compensation layer 51, that is, compensating anode capacitances of the multiple first light emitting elements that emit green light. Rest of the structure of the display substrate may be referred to descriptions of the aforementioned embodiments, and will not be repeated here.

Table 1 shows the comparison results of anode capacitances of multiple first light emitting elements that emit green light before and after compensation. Table 1 takes multiple first light emitting elements that emit green light in a row of first light emitting elements from a center to an edge of the first display region shown in FIG. 4 as an example.

TABLE 1

| A position of a first light emitting element emitting green light | Anode capacitance without a compensation capacitance electrode plate | Anode capacitance with a compensation capacitor electrode plate |
|---|---|---|
| 2 | 366.10 | 488.10 |
| 4 | 347.61 | 472.61 |
| 6 | 329.15 | 457.15 |
| 8 | 310.69 | 441.69 |
| 10 | 292.23 | 426.23 |
| 12 | 273.74 | 410.74 |
| 14 | 243.82 | 383.82 |
| 16 | 227.17 | 370.17 |
| 18 | 210.48 | 356.48 |
| 20 | 193.78 | 342.78 |
| 22 | 177.09 | 329.09 |
| 24 | 160.40 | 315.40 |
| 26 | 143.49 | 301.49 |
| 28 | 126.80 | 287.80 |
| 30 | 110.10 | 274.10 |
| 32 | 93.40 | 260.40 |
| 34 | 76.70 | 246.70 |
| 36 | 60.00 | 233.00 |
| 38 | 43.28 | 219.28 |
| 40 | 31.33 | 210.33 |

Based on Table 1, a ratio of the maximum anode capacitance to the minimum anode capacitance of first light emitting elements that emit green light in the display substrate without a compensation capacitance electrode plate is about 3.92, and a ratio of the maximum anode capacitance to the minimum anode capacitance of the first light emitting elements that emit green light in the display substrate in this example is about 1.87. Thus, by providing the capacitance compensation layer in the first display region, the anode capacitance of multiple first light emitting elements that emit green light in the first display region can be increased as a whole, so that a difference between the maximum anode capacitance and the minimum anode capacitance is reduced.

FIG. 14 is another partial cross sectional schematic diagram of a display substrate according to at least one embodiment of the present disclosure. In some exemplary implementations, as shown in FIG. 14, the first display region may be provided with a capacitance compensation layer 51 and the capacitance compensation layer 51 may be located on a side of a second source-drain metal layer 30 close to the base substrate 100. The capacitance compensation layer 51 may be located between the second source-drain metal layer 30 and the first source-drain metal layer. However, the embodiment is not limited thereto. In other examples, the capacitance compensation layer 51 and the first source-drain metal layer of the second display region may be of a same layer structure. Or, the capacitance compensation layer 51 and a second gate metal layer of the second display region may be of a same layer structure. Rest of the structure of the display substrate according to the embodiment may be referred to descriptions of the aforementioned embodiments, and will not be repeated here.

An embodiment of the present disclosure may also provide a method for preparing a display substrate, which is used for preparing the display substrate as described above. The method includes: forming a circuit structure layer, at least one capacitance compensation layer, at least one conductive layer and a light emitting structure layer on the base substrate. The display substrate includes a first display region and a second display region at least partially surrounding the first display region. The circuit structure layer is located at a side of the base substrate and includes multiple first pixel circuits located in the second display region. The light emitting structure layer is located on a side of the circuit structure layer away from the base substrate and includes multiple first light emitting elements located in the first display region. At least one conductive layer is located between the circuit structure layer and the light emitting structure layer and includes multiple conductive lines. At least one first pixel circuit of the multiple first pixel circuits is electrically connected with at least one first light emitting element of multiple first light emitting elements through a conductive line of at least one conductive layer. At least one first pixel circuit is configured to drive at least one first light emitting element to emit light. At least one capacitance compensation layer is located in the first display region and on a side of the light emitting structure layer close to the base substrate. The capacitance compensation layer includes at least one compensation capacitance electrode plate. An anode of at least one first light emitting element is electrically connected with a compensation capacitance electrode plate of at least one capacitance compensation layer.

Relevant description of the method for preparing the display substrate of the embodiment may be as described above, which will not be repeated herein.

At least one embodiment of the present disclosure further provides a display apparatus which includes the display substrate as described above.

Figure 15:
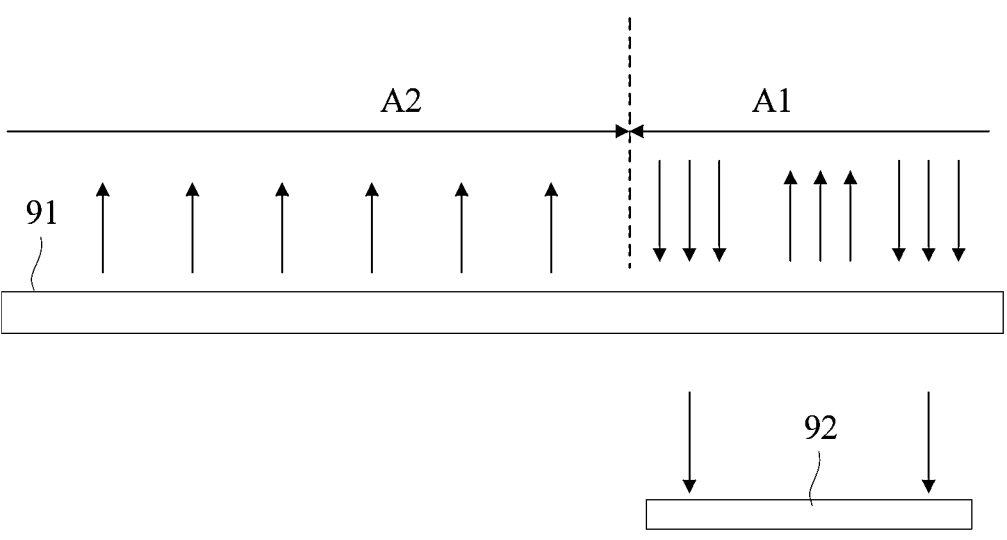
FIG. 15 is a schematic diagram of a display apparatus according to at least one embodiment of the present disclosure.

FIG. 15 is a schematic diagram of a display apparatus according to at least one embodiment of the present disclosure. As shown in FIG. 15, a display apparatus is provide in this embodiment, which includes a display substrate 91 and a photosensitive sensor 92 located on a light exiting side of a display structure layer away from the display substrate 91. The photosensitive sensor 92 is located on a side of a non-display surface of the display substrate 91. An orthographic projection of the photosensitive sensor 92 on the display substrate 91 is overlapped with the first display region A1.

In some exemplary implementations, the display substrate 91 may be a flexible OLED display substrate, a QLED display substrate, a Micro-LED display substrate or a Mini-LED display substrate. The display device may be any product or component with a display function such as an OLED display, a cell phone, a tablet, a television, a display, a laptop, a digital photo frame, a navigator, and so on, which is not limited in the embodiments of the present disclosure.

The drawings of the present disclosure only relate to structures involved in the present disclosure, and other structures may refer to conventional designs. The embodiments in the present disclosure, i.e., features in the embodiments, may be combined with each other to obtain new embodiments if there is no conflict. Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A display substrate, comprising:
   a base substrate, comprising a first display region and a second display region at least partially surrounding the first display region;
   a circuit structure layer, located at a side of the base substrate and comprising a plurality of first pixel circuits located in the second display region;
   a light emitting structure layer, located on a side of the circuit structure layer away from the base substrate and comprising a plurality of first light emitting elements located in the first display region;
   at least one conductive layer, located between the circuit structure layer and the light emitting structure layer and comprising a plurality of conductive lines; wherein at least one first pixel circuit of the plurality of first pixel circuits is electrically connected with at least one first light emitting element of the plurality of first light emitting elements through a conductive line of the at least one conductive layer, and the at least one first pixel circuit is configured to drive the at least one first light emitting element to emit light; and
   at least one capacitance compensation layer, located in the first display region and on a side of the light emitting structure layer close to the base substrate, wherein the capacitance compensation layer comprises at least one compensation capacitance electrode plate; an anode of the at least one first light emitting element is electrically connected with a compensation capacitance electrode plate of the at least one capacitance compensation layer,
   wherein in a row of first light emitting elements along a direction from a center to an edge of the first display region, a first light emitting element close to the center of the first display region is electrically connected with a first pixel circuit away from the first display region in the second display region, and a first light emitting element away from the center of the first display region is electrically connected with a first pixel circuit close to the first display region in the second display region;
   a compensation capacitance generated by the first light emitting element close to the center of the first display region by electrically connecting a compensation capacitance electrode plate is less than a compensation capacitance generated by the first light emitting element away from the center of the first display region by electrically connecting a compensation capacitance electrode plate,
   a number of transparent conductive lines covered by the anode of the first light emitting element close to the center of the first display region is less than a number of transparent conductive lines covered by the anode of the first light emitting element away from the center of the first display region.

2. The display substrate according to claim 1, wherein an orthographic projection of the anode of the first light emitting element on the base substrate comprises an orthographic projection of a compensation capacitance electrode plate with which the first light emitting element is electrically connected on the base substrate.

3. The display substrate according to claim 1, wherein a material of the at least one conductive layer comprises a transparent conductive material.

4. The display substrate according to claim 3, wherein the at least one capacitance compensation layer is located on a side of the at least one conductive layer close to the base substrate.

5. The display substrate according to claim 4, wherein the at least one conductive layer comprises a plurality of anode connection electrodes; the compensation capacitance electrode plate of the at least one capacitance compensation layer is electrically connected with the anode of the first light emitting element through an anode connection electrode of the at least one conductive layer.

6. The display substrate according to claim 5, wherein an orthographic projection of the compensation capacitance electrode plate on the base substrate is partially overlapped with an orthographic projection of the anode connection electrode of the at least one conductive layer on the base substrate.

7. The display substrate according to claim 5, wherein the at least one conductive layer comprises a first transparent conductive layer, a second transparent conductive layer, and a third transparent conductive layer provided sequentially in a direction away from the base substrate;

the first transparent conductive layer comprises a plurality of first anode connection electrodes, the second transparent conductive layer comprises a plurality of third anode connection electrodes, and the third transparent conductive layer comprises a plurality of fifth anode connection electrodes; the compensation capacitance electrode plate of the at least one capacitance compensation layer is electrically connected with the anode of the first light emitting element through a first anode connection electrode of the first transparent conductive layer, a third anode connection electrode of the second transparent conductive layer and a fifth anode connection electrode of the third transparent conductive layer.

8. The display substrate according to claim 7, wherein the first transparent conductive layer further comprises at least one first transparent conductive line, the second transparent conductive layer further comprises at least one second transparent conductive line, and the third transparent conductive layer further comprises at least one third transparent conductive line;

an orthographic projection of the at least one compensation capacitance electrode plate on the base substrate is overlapped with at least one of an orthographic projection of the first transparent conductive line, an orthographic projection of the second transparent conductive line, and an orthographic projection of the third transparent conductive line on the base substrate.

9. The display substrate according to claim 8, wherein the orthographic projection of the second transparent conductive line on the base substrate is overlapped with the orthographic projection of the first transparent conductive line on the base substrate, and the orthographic projection of the third transparent conductive line on the base substrate is overlapped with both the orthographic projection of the first transparent conductive line and the orthographic projection of the second transparent conductive line on the base substrate.

10. The display substrate according to claim 8, wherein a first transparent conductive line and a first anode connection electrode are in an integral structure, a second transparent conductive line and a third anode connection electrode are in an integral structure, and a third transparent conductive line and a fifth anode connection electrode are in an integral structure.

11. The display substrate according to claim 1, wherein a material of the capacitance compensation layer comprises a metal material.

12. The display substrate according to claim 1, wherein in a direction perpendicular to the display substrate, the circuit structure layer of the second display region comprises a semiconductor layer, a first gate metal layer, a second gate metal layer and a first source-drain metal layer provided on the base substrate;

the at least one capacitance compensation layer and one of the following are of a same layer structure: the first gate metal layer, the second gate metal layer and the first source-drain metal layer.

13. The display substrate according to claim 1, wherein in a direction perpendicular to the display substrate, the circuit structure layer of the second display region comprises: a semiconductor layer, a first gate metal layer, a second gate metal layer, and a first source-drain metal layer provided on the base substrate; the at least one capacitance compensation layer is located on a side of the first source-drain metal layer away from the base substrate.

14. The display substrate according to claim 13, further comprises a second source-drain metal layer located in the second display region and on a side of the circuit structure layer away from the base substrate;

the at least one capacitance compensation layer and the second source-drain metal layer are of a same layer structure, or the at least one capacitance compensation layer is located between the first source-drain metal layer and the second source-drain metal layer.

15. The display substrate according to claim 1, wherein the plurality of first light emitting elements comprises a plurality of first light emitting elements that emit light of a first color, a plurality of first light emitting elements that emit light of a second color, and a plurality of first light emitting elements that emit light of a third color; the plurality of first light emitting elements that emit the light of the first color are electrically connected with a plurality of compensation capacitance electrode plates of the capacitance compensation layer.

16. The display substrate according to claim 15, wherein the first color is green, the second color is red, and the third color is blue.

17. The display substrate according to claim 1, wherein the circuit structure layer further comprises a plurality of second pixel circuits located in the second display region, and the light emitting structure layer further comprises a plurality of second light emitting elements located in the second display region;

at least one second pixel circuit of the plurality of second pixel circuits is electrically connected with at least one second light emitting element of the plurality of second light emitting elements, and the at least one second pixel circuit is configured to drive the at least one second light emitting element to emit light.

18. A display apparatus, comprising the display substrate according to claim 1.

19. The display apparatus according to claim 18, further comprising a photosensitive sensor located on a side of a non-display surface of the display substrate, wherein an orthographic projection of the photosensitive sensor on the display substrate is overlapped with the first display region of the display substrate.

* * * * *